US012648142B2

(12) United States Patent
Choi et al.

(10) Patent No.: US 12,648,142 B2
(45) Date of Patent: Jun. 2, 2026

(54) NON-VOLATILE MEMORY DEVICE AND ELECTRONIC SYSTEM INCLUDING THE SAME

(71) Applicant: Samsung Electronics Co., Ltd., Suwon-si (KR)

(72) Inventors: Dongsung Choi, Suwon-si (KR); Byongju Kim, Suwon-si (KR); Wonjun Park, Suwon-si (KR); Jaemin Jung, Suwon-si (KR); Changheon Cheon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 412 days.

(21) Appl. No.: 18/493,853

(22) Filed: Oct. 25, 2023

(65) Prior Publication Data

US 2024/0224523 A1     Jul. 4, 2024

(30) Foreign Application Priority Data

Dec. 28, 2022    (KR) ......................... 10-2022-0187969

(51) Int. Cl.
*H10B 43/27*          (2023.01)
*H10B 41/27*          (2023.01)
(Continued)

(52) U.S. Cl.
CPC ............. *H10B 43/27* (2023.02); *H10B 41/27* (2023.02); *H10B 41/41* (2023.02); *H10B 43/40* (2023.02)

(58) Field of Classification Search
CPC ........ H10B 41/41; H10B 43/10; H10B 43/50; H10B 41/35; H10B 43/35; H10B 41/40; H10B 41/50; G11C 16/0466
See application file for complete search history.

(56) References Cited

U.S. PATENT DOCUMENTS 10,283,566 B2    5/2019    Sel et al.
10,748,923 B2    8/2020    Son et al.
(Continued)

FOREIGN PATENT DOCUMENTS

EP          3557622 A2    10/2019

OTHER PUBLICATIONS

Extended European Search Report for EP 23213126.8 mailed May 27, 2024, 9 pages.

*Primary Examiner* — Fernando L Toledo
*Assistant Examiner* — Adam S Bowen
(74) *Attorney, Agent, or Firm* — Wolf, Greenfield & Sacks, P.C.

(57)          ABSTRACT

A non-volatile memory device includes a substrate, a mold structure including a plurality of gate electrodes and a plurality of mold insulating layers, wherein the plurality of gate electrodes are stacked in a step shape, a channel structure that extends through the mold structure, and a cell contact that extends through the mold structure, the cell contact is connected to a first gate electrode, and the cell contact is not electrically connected to a second gate electrode among the plurality of gate electrodes, wherein the first gate electrode includes: an extension portion; a pad portion having a vertical thickness greater than a vertical thickness of the extension portion; and a connection portion that electrically connects the pad portion to the cell contact, the connection portion has a vertical thickness less than a vertical thickness of the pad portion, and one or more first insulating rings on the connection portion.

20 Claims, 27 Drawing Sheets

(51) Int. Cl.
    _H10B 41/41_            (2023.01)
    _H10B 43/40_            (2023.01)

(56)                References Cited

U.S. PATENT DOCUMENTS

| | | | |
|---|---|---|---|
| 10,991,717 | B2 | 4/2021 | Baek |
| 11,289,507 | B2 | 3/2022 | Kanamori et al. |
| 2018/0226423 | A1 | 8/2018 | Kang et al. |
| 2020/0105783 | A1 | 4/2020 | Baek |
| 2021/0193672 | A1* | 6/2021 | Kim ...................... H10B 43/50 |

* cited by examiner

NON-VOLATILE MEMORY DEVICE AND ELECTRONIC SYSTEM INCLUDING THE SAME

CROSS-REFERENCE TO RELATED APPLICATION

This application is based on and claims priority under 35 U.S.C. § 119 to Korean Patent Application No. 10-2022-0187969, filed on Dec. 28, 2022, in the Korean Intellectual Property Office, the disclosure of which is incorporated by reference herein in its entirety.

TECHNICAL FIELD

The present disclosure relates to a non-volatile memory device and an electronic system including the same, and more particularly, to a non-volatile memory device having a vertical channel and an electronic system including the non-volatile memory device.

BACKGROUND

It may be desirable to increase the degree of integration of non-volatile memory devices to meet the high performance and low price desired by consumers. In the case of a non-volatile memory device, the degree of integration is a factor in determining the price of a product, and as such, an increased degree of integration may be desired.

In the case of a two-dimensional or planar non-volatile memory device, the degree of integration may be determined by an area occupied by a unit memory cell, and as such, the degree of integration may be affected by the level of a technology of forming a fine pattern. However, because expensive equipment may be required for miniaturization of a pattern, it is still limited. Accordingly, 3D non-volatile memory devices including memory cells arranged three-dimensionally have been proposed.

SUMMARY

The present disclosure provides a non-volatile memory device with improved performance and reliability.

The present disclosure provides an electronic system with improved performance and reliability.

The technical problems to be solved by the present disclosure are not limited to the problems mentioned above, and other problems not mentioned will be clearly understood by those skilled in the art from the description below.

According to an aspect of the present disclosure, a non-volatile memory device includes: a substrate including a memory cell region and a connection region; a mold structure including a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region and include a first gate electrode and a second gate electrode; a channel structure extends through the mold structure on the memory cell region; and a cell contact that extends through the mold structure, wherein the cell contact is electrically connected to the first gate electrode, and wherein the cell contact is not electrically connected to the second gate electrode, wherein the first gate electrode includes: an extension portion extending in the memory cell region; a pad portion, wherein a vertical thickness of the pad portion is greater than a vertical thickness of the extension portion; and a connection portion that electrically connects the pad portion to the cell contact, wherein a vertical thickness of the connection portion has is less than the vertical thickness of the pad portion. The non-volatile memory device includes one or more first insulating rings on the connection portion.

According to another aspect of the present disclosure, a non-volatile memory device includes: a peripheral circuit substrate; a peripheral circuit on the peripheral circuit substrate; a cell substrate including a memory cell region and a connection region on the peripheral circuit substrate; a cell contact that extends through a mold structure, the mold structure including a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region; wherein the plurality of gate electrodes include a first gate electrode and a second gate electrode, wherein the first gate electrode includes an extension portion that extends on the memory cell region, a pad portion, and a connection portion, wherein a vertical thickness of the pad portion is greater than a vertical thickness of the extension portion, wherein a vertical thickness of the connection portion is less than the vertical thickness of the pad portion, and wherein the connection portion electrically connects the pad portion to the cell contact, wherein the cell contact is connected to the connection portion of the first gate electrode and is not electrically connected to the second gate electrode in the connection region; a channel structure extends through the mold structure on the memory cell region; one or more insulating rings on the connection portion; and a dielectric liner between the first gate electrode and a first mold insulating layer of the plurality of mold insulating layers adjacent to the first gate electrode, wherein the dielectric liner includes a first portion between the connection portion and the one or more insulating rings.

According to an aspect of the present disclosure, an electronic system includes: a main substrate; a non-volatile memory device on the main substrate; and a controller that is electrically connected to the non-volatile memory device, wherein the non-volatile memory device includes: a substrate including a memory cell region and a connection region; a cell contact that extends through a mold structure, the mold structure including a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region; wherein the plurality of gate electrodes include a first gate electrode and a second gate electrode, wherein the first gate electrode includes an extension portion that extends on the memory cell region, a connection portion, and a pad portion, wherein a vertical thickness of the pad portion is greater than a vertical thickness of the extension portion, wherein a vertical thickness of the connection portion is less than the vertical thickness of the pad portion, wherein the connection portion electrically connects the pad portion to the cell contact, wherein the cell contact is connected to a connection portion of the first gate electrode, and wherein the cell contact is not electrically connected to the second gate electrode in the connection region, a channel structure that extends through the mold structure on the memory cell region; a first insulating ring on the connection portion; and a dielectric liner between the first gate electrode and a first mold insulating layer of the plurality of mold insulating layers, and the dielectric liner includes a first portion between the connection portion and the first insulating ring.

BRIEF DESCRIPTION OF THE DRAWINGS

Embodiments will be more clearly understood from the following detailed description taken in conjunction with the accompanying drawings in which:

FIG. 4 is a plan view of the non-volatile memory device of FIG. 3;

FIGS. 10, 11, 12, 13, and 14 are cross-sectional views corresponding to the cross-section taken along line A-A' of FIG. 4;

DETAILED DESCRIPTION OF THE EMBODIMENTS

Figure 1:
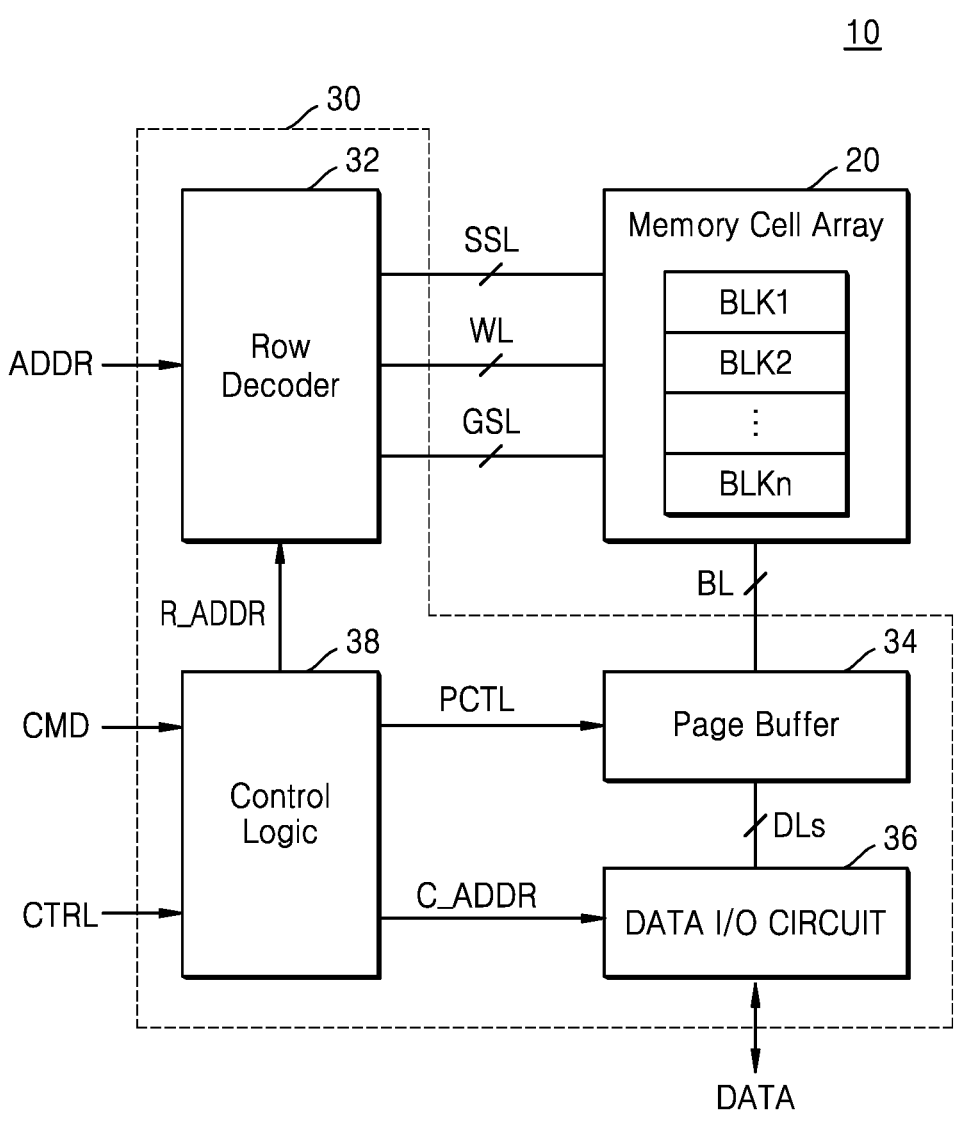
FIG. 1 is a block diagram of a non-volatile memory device according to embodiments of the present disclosure.

To clarify the present disclosure, parts that are not connected with the description will be omitted, and the same elements or equivalents are referred to by the same reference numerals throughout the specification. Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

In addition, unless explicitly described to the contrary, the word "comprises", and variations such as "comprises" or "comprising", will be understood to imply the inclusion of stated elements but not the exclusion of any other elements. As used herein, the phrase "at least one of A, B, and C" refers to a logical (A OR B OR C) using a non-exclusive logical OR, and should not be construed to mean "at least one of A, at least one of B and at least one of C." As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements and/or components, but do not preclude the presence or addition of one or more other features, steps, operations, elements, components and/or groups thereof. The term "and/or" includes any and all combinations of one or more of the associated listed items.

Hereinafter, embodiments according to the present disclosure will be described in detail with reference to the accompanying drawings.

FIG. 1 is a block diagram of a non-volatile memory device 10 according to embodiments of the present disclosure.

Referring to FIG. 1, the non-volatile memory device 10 may include a memory cell array 20 and a peripheral circuit 30. The memory cell array 20 includes a plurality of memory cell blocks BLK1, BLK2, . . . , BLKn. Each of the plurality of memory cell blocks BLK1, BLK2, . . . , BLKn may include a plurality of memory cells. The plurality of memory cell blocks BLK1, BLK2, . . . , BLKn may be connected to the peripheral circuit 30 through a bit line BL, a word line WL, a string select line SSL, and a ground select line GSL.

The peripheral circuit 30 may include a row decoder 32, a page buffer 34, a data input/output circuit 36, and a control logic 38. Although not shown in FIG. 1, the peripheral circuit 30 may further include an input/output interface, a column logic, a voltage generator, a pre-decoder, a temperature sensor, a command decoder, an address decoder, an amplifier circuit, and the like.

The memory cell array 20 may be connected to the page buffer 34 through a bit line BL, and may be connected to the row decoder 32 through the word line WL, the string select line SSL, and the ground select line GSL. In the memory cell array 20, each of the plurality of memory cells included in the plurality of memory cell blocks BLK1, BLK2, . . . , BLKn may be a flash memory cell. The memory cell array 20 may include a three-dimensional (3D) memory cell array. The 3D memory cell array may include a plurality of NAND strings, and each of the plurality of NAND strings may include a plurality of memory cells connected to a plurality of word lines WL vertically stacked on a substrate.

The peripheral circuit 30 may receive an address ADDR, a command CMD, and a control signal CTRL from a device external to the non-volatile memory device 10 and may transmit/receive data DATA with a device external to the non-volatile memory device 10.

The row decoder 32 may select at least one of the plurality of memory cell blocks BLK1, BLK2, . . . , BLKn in response to an external address ADDR, and may select a word line WL, a string select line SSL, and a ground select line GSL of the selected memory cell block. The row decoder 32 may transmit a voltage for performing a memory operation to the word line WL of the selected memory cell block.

The page buffer 34 may be connected to the memory cell array 20 through a bit line BL. The page buffer 34 operates as a write driver during a program operation to apply a voltage according to data DATA to be stored in the memory cell array 20 to the bit line BL, and may detect data DATA stored in the memory cell array 20 by operating as a sense amplifier during a read operation. The page buffer 34 may operate according to a control signal PCTL provided by the control logic 38.

The data input/output circuit 36 may be connected to the page buffer 34 through data lines DLs. The data input/output circuit 36 may receive data DATA from a memory controller (not shown) during a program operation, and may provide program data DATA to the page buffer 34 based on a column address C_ADDR provided by the control logic 38. During a read operation, the data input/output circuit 36 may provide the read data DATA stored in the page buffer 34 to the memory controller based on the column address C_ADDR provided by the control logic 38.

The data input/output circuit 36 may transfer an input address or a command to the control logic 38 or the row decoder 32. The peripheral circuit 30 may further include an Electro Static Discharge (ESD) circuit and a pull-up/pull-down driver.

The control logic 38 may receive a command CMD and a control signal CTRL from the memory controller. The control logic 38 may provide a row address R_ADDR to the row decoder 32 and the column address C_ADDR to the data input/output circuit 36. The control logic 38 may generate various internal control signals used in the non-volatile memory device 10 in response to the control signal CTRL. For example, the control logic 38 may adjust a voltage level provided to the word line WL and the bit line BL when a memory operation, such as a program operation or an erase operation, is performed.

Figure 2:
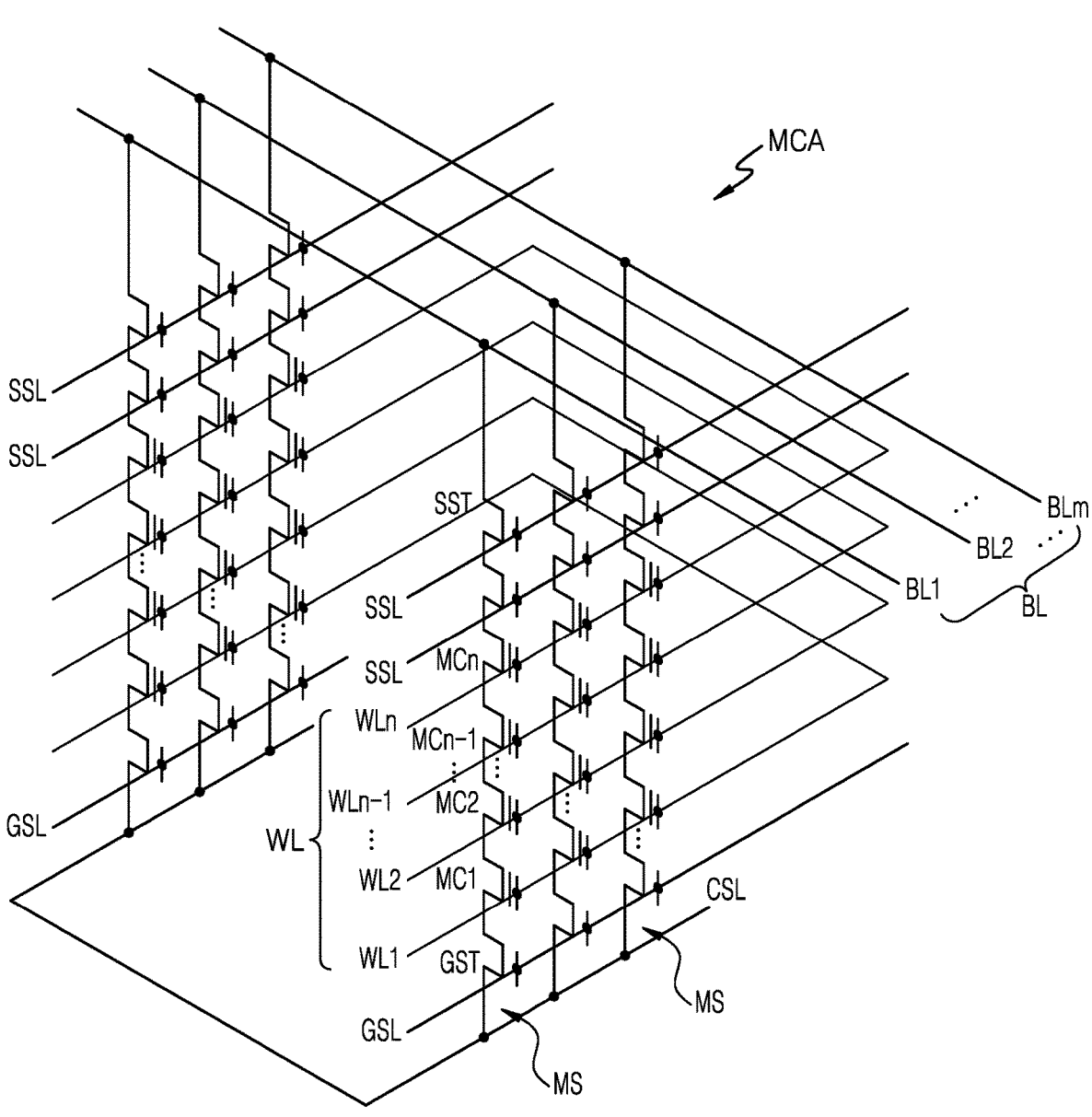
FIG. 2 is an equivalent circuit diagram of a memory cell array of a non-volatile memory device according to embodiments of the present disclosure.

FIG. 2 is an equivalent circuit diagram of a memory cell array MCA of a non-volatile memory device 10 according to embodiments of the present disclosure.

Referring to FIG. 2, the memory cell array MCA may include a plurality of memory cell strings MS. The memory cell array MCA may include a plurality of bit lines BL (BL1, BL2, . . . , BLm), a plurality of word lines WL (WL1, WL2, . . . , WLn-1, WLn), at least one string select line SSL, at least one ground select line GSL, and a common source line CSL. A plurality of memory cell strings MS may be formed between the plurality of bit lines BL (BL1, BL2, . . . , BLm) and the common source line CSL. In FIG. 2, although an embodiment is illustrated in which each of the plurality of memory cell strings MS includes two string select lines SSL, the technical aspect of the present disclosure is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, . . . , MCn-1, MCn. A drain region of the string select transistor SST may be connected to bit lines BL (BL1, BL2, . . . , BLm), and a source region of the ground select transistor GST may be connected to the common source line CSL. The common source line CSL may be a region where source regions of the plurality of ground select transistors GST are commonly connected.

The string select transistor SST may be connected to the string select line SSL, and the ground select transistor GST may be connected to the ground select line GSL. The plurality of memory cell transistors MC1, MC2, . . . , MCn-1, MCn may be connected to the plurality of word lines WL (WL1, WL2, . . . , WLn-1, WLn), respectively.

Figure 3:
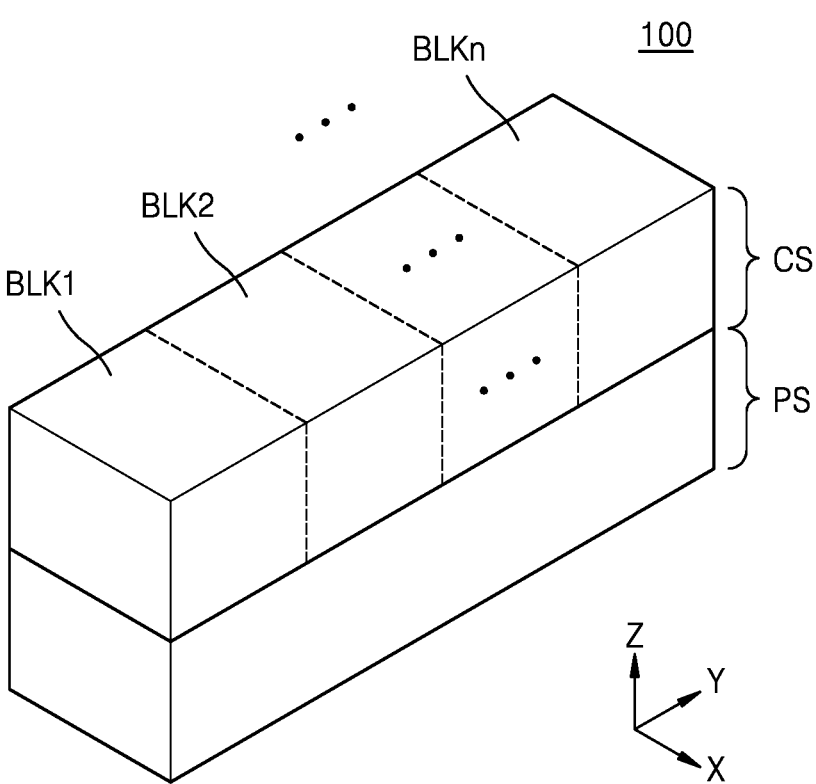
FIG. 3 is a perspective view illustrating a representative configuration of a non-volatile memory device according to embodiments of the present disclosure.
Figure 4:
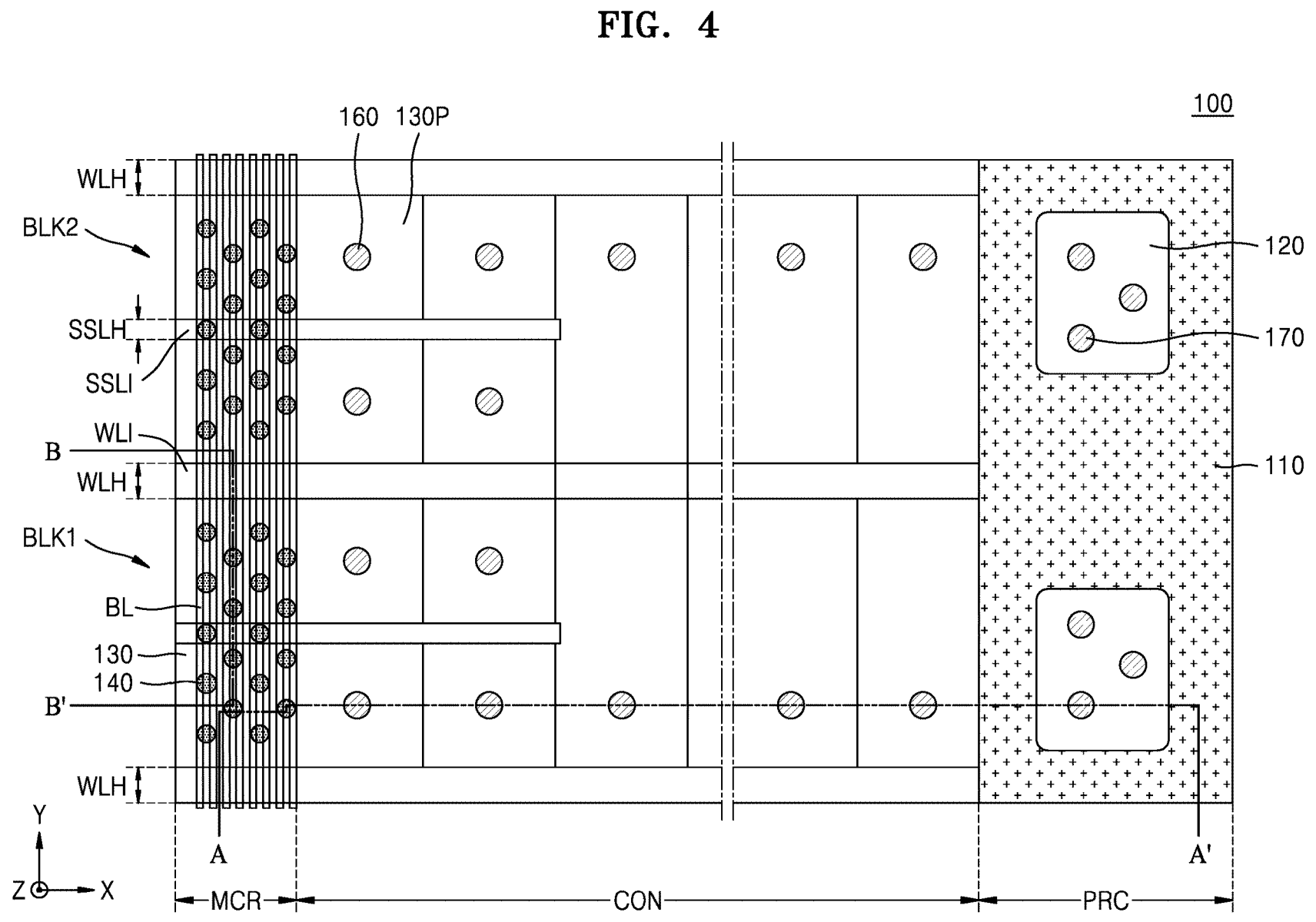
Figure 5:
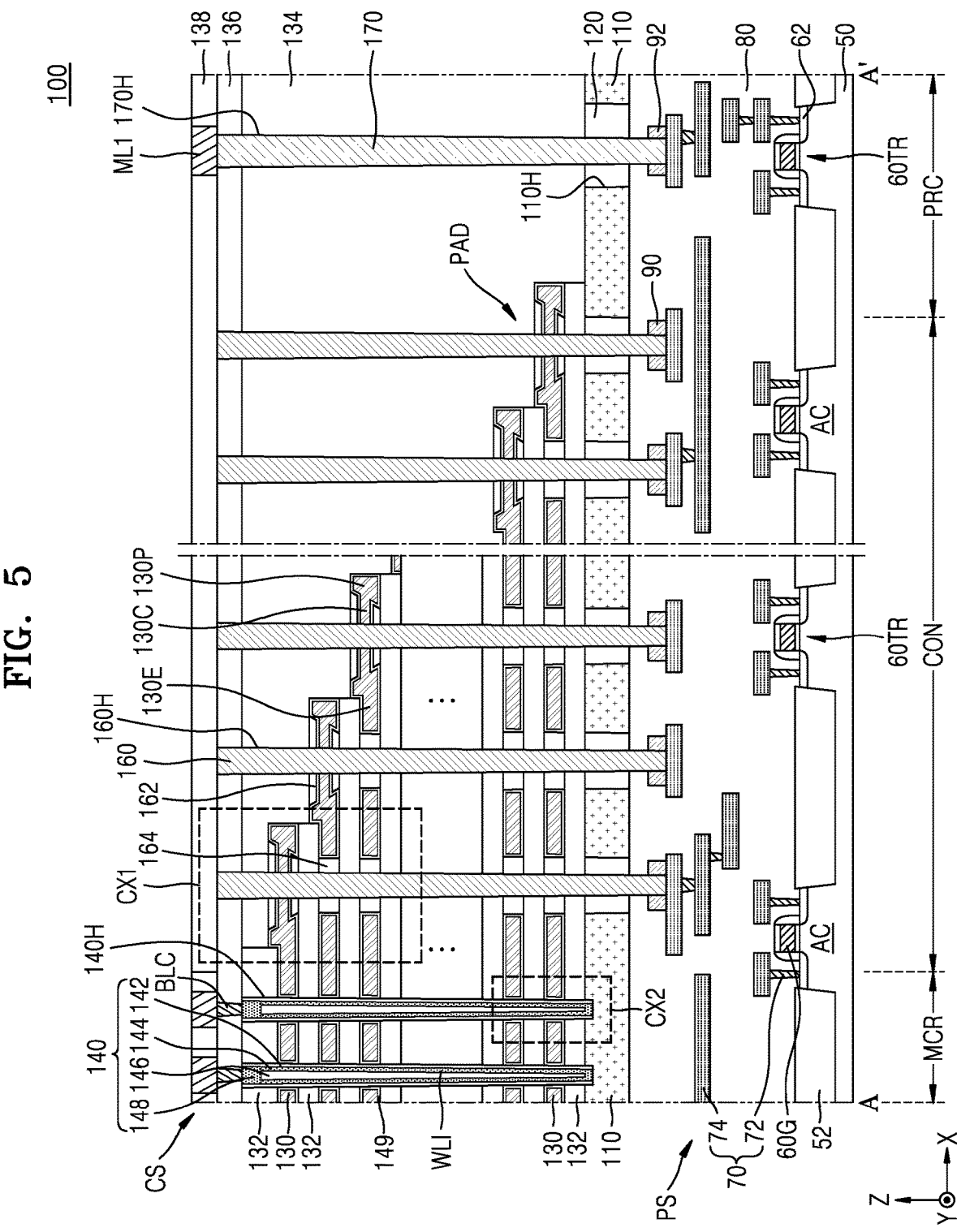
FIG. 5 is a cross-sectional view taken along line A-A' of FIG. 4.
Figure 6:
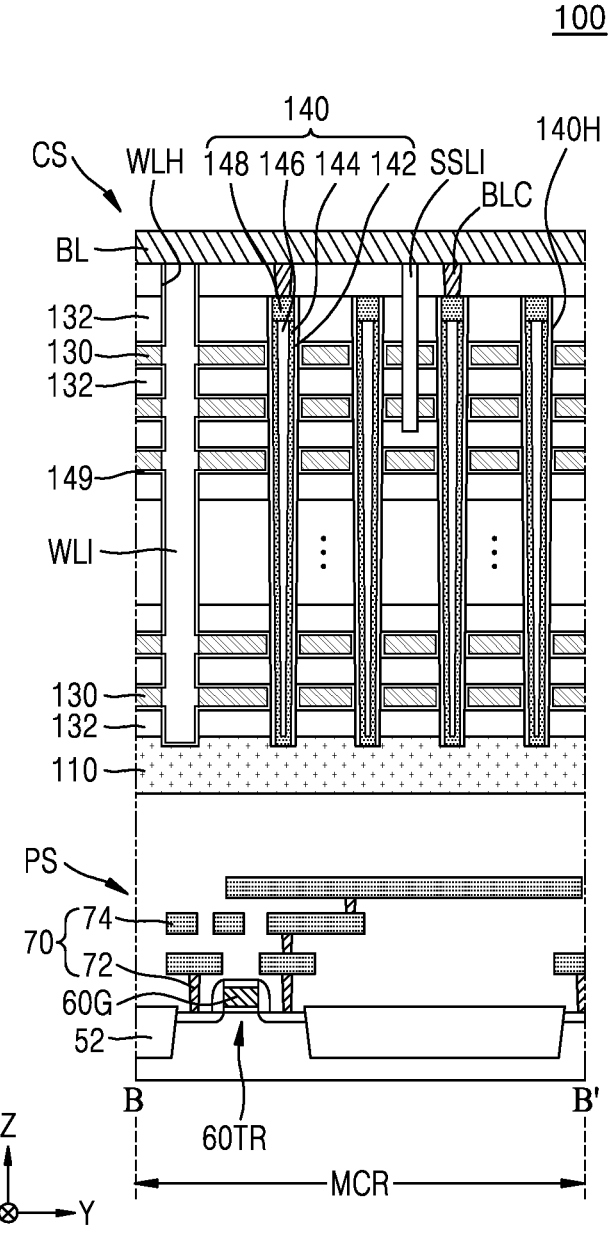
FIG. 6 is a cross-sectional view taken along line BB' of FIG. 4.
Figure 7:
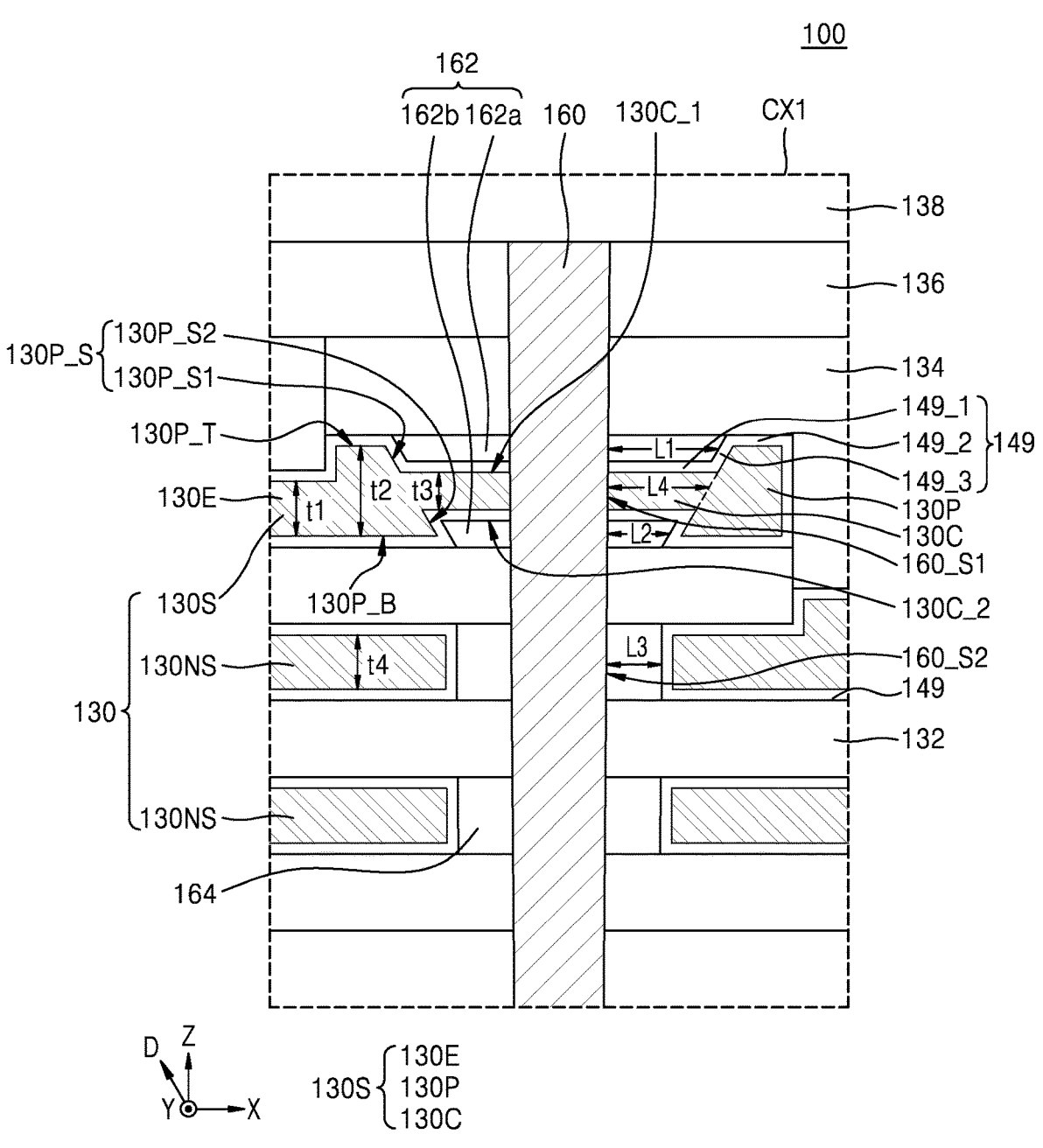
FIG. 7 is an enlarged view of a portion CX1 of FIG. 5.
Figure 8:
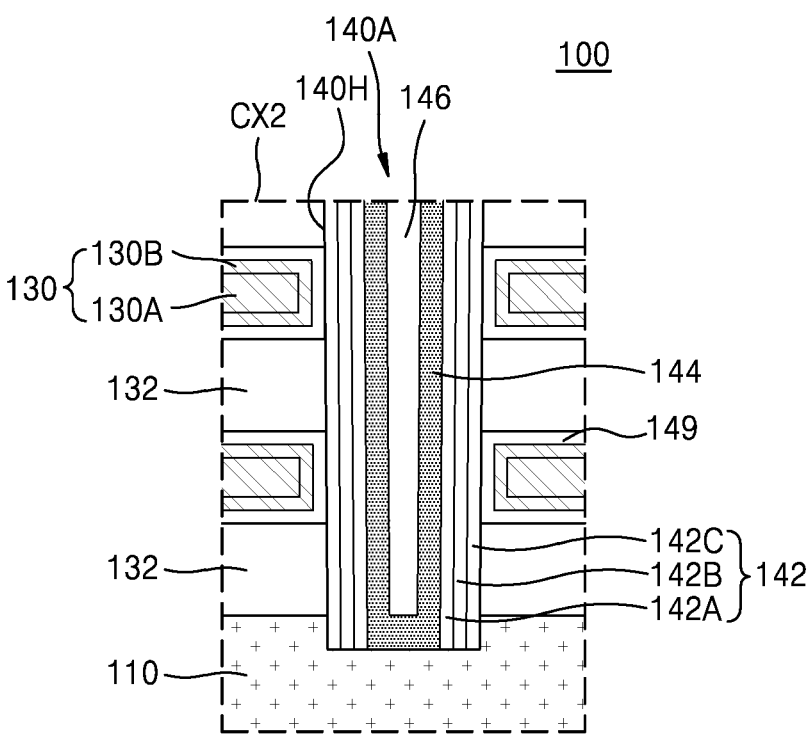
FIG. 8 is an enlarged view of a portion CX2 of FIG. 5.

FIGS. 3 to 8 are diagrams of a non-volatile memory device 100 according to embodiments of the present disclosure. Specifically, FIG. 3 is a perspective view illustrating a representative configuration of a non-volatile memory device 100, and FIG. 4 is a plan view of the non-volatile memory device 100 of FIG. 3. FIG. 5 is a cross-sectional view taken along line A-A' of FIG. 4. FIG. 6 is a cross-sectional view taken along line B-B' of FIG. 4. FIG. 7 is an enlarged view of a portion CX1 of FIG. 5. FIG. 8 is an enlarged view of a portion CX2 of FIG. 5.

Referring to FIGS. 3 to 8, the non-volatile memory device 100 includes a cell array structure CS and a peripheral circuit structure PS that overlap each other in a vertical direction Z. The cell array structure CS may include the memory cell array 20 described with reference to FIG. 1, and the peripheral circuit structure PS may include the peripheral circuit 30 described with reference to FIG. 1.

The cell array structure CS may include a plurality of memory cell blocks BLK1, BLK2, . . . , BLKn. Each of the plurality of memory cell blocks BLK1, BLK2, . . . , BLKn may include three-dimensionally arranged memory cells.

The peripheral circuit structure PS may include a peripheral circuit transistor 60TR and a peripheral circuit wiring structure 70 on a substrate 50. The substrate 50 may include a horizontally arranged memory cell region MCR, a connection region CON, and a peripheral circuit connection region PRC. Active regions AC may be defined on the substrate 50 by the device isolation film 52, and a plurality of peripheral circuit transistors 60TR may be formed on the active region AC. The plurality of peripheral circuit transistors 60TR may include a peripheral circuit gate 60G and a source/drain region 62 on a portion of the substrate 50 on both sides of the peripheral circuit gate 60G.

The substrate 50 may include a semiconductor material, for example, a Group IV semiconductor, a Group III-V compound semiconductor, or a Group II-VI oxide semiconductor. For example, the Group IV semiconductor may include silicon (Si), germanium (Ge), or silicon-germanium. The substrate 50 may be provided as a bulk wafer or an epitaxial layer. In another embodiment, the substrate 50 may include a silicon-on-insulator (SOI) substrate or a germanium-on-insulator (GeOI) substrate.

The peripheral circuit wiring structure 70 includes a plurality of peripheral circuit contacts 72 and a plurality of peripheral circuit wiring layers 74. An interlayer insulating film 80 covering the peripheral circuit transistor 60TR and the peripheral circuit wiring structure 70 may be on the substrate 50. The plurality of peripheral circuit wiring layers 74 may have a multilayer structure including a plurality of metal layers arranged at different vertical levels.

A common source plate 110 may be on the interlayer insulating film 80. In some embodiments, the common source plate 110 may function as a source region supplying a current to vertical memory cells formed in the cell array structure CS. The common source plate 110 may be on the memory cell region MCR, the connection region CON, and the peripheral circuit connection region PRC of the substrate 50.

In some embodiments, the common source plate 110 may include at least one of silicon (Si), germanium (Ge), silicon germanium (SiGe), gallium arsenide (GaAs), indium gallium arsenide (InGaAs), aluminum gallium arsenide (AlGaAs), or a combination thereof. The common source plate 110 may include a semiconductor doped with an n-type impurity. The common source plate 110 may have a crystal structure including at least one of a single crystal structure, an amorphous structure, and polycrystalline structure. In some examples, the common source plate 110 may be polysilicon doped with an n-type impurity.

The common source plate 110 may include an opening 110H on the connection region CON and the peripheral circuit connection region PRC of the substrate 50, and an insulating plug 120 may fill an opening 110H of the common source plate 110. The insulating plug 120 may have an upper surface at the same level as an upper surface of the common source plate 110.

A plurality of gate electrodes 130 and a plurality of mold insulating layers 132 may be alternately arranged on the common source plate 110 on the memory cell region MCR and the connection region CON in the vertical direction Z.

As shown in FIG. 8, the gate electrode 130 may include a buried conductive layer 130A and a conductive barrier layer 130B surrounding upper, lower, and side surfaces of the buried conductive layer 130A. For example, the buried conductive layer 130A may include a metal (e.g., tungsten, nickel, cobalt, or tantalum) or a metal silicide (e.g., tungsten silicide, nickel silicide, cobalt silicide, tantalum silicide, doped polysilicon, or a combination thereof). In some embodiments, the conductive barrier layer 130B may include titanium nitride, tantalum nitride, tungsten nitride, or a combination thereof.

In some embodiments, the plurality of gate electrodes 130 may correspond to the ground select lines GSL, word lines WL (WL1, WL2, . . . , WLn-1, WLn), and at least one string select line SSL that constitute the memory cell string MS (refer to FIG. 2). For example, the lowermost gate electrode 130 functions as a ground select line GSL, the uppermost two gate electrodes 130 function as a string select line SSL, and the remaining gate electrodes 130 function as word lines WL (WL1, WL2, . . . , WLn-1, WLn). Accordingly, a memory cell string MS in which the ground select transistor GST, the string select transistor SST, and the memory cell transistors MC1, MC2, . . . , MCn-1, MCn therebetween are connected in series may be provided. In some embodiments, at least one of the gate electrodes 130 may function as a dummy word line, but is not limited thereto.

As shown in FIG. 6 as an example, a plurality of gate stack isolation openings WLH may extend in a first horizontal direction X parallel to the upper surface of the common source plate 110 on the common source plate 110. The plurality of gate electrodes 130 between the pair of gate stack isolation openings WLH may constitute one block. For example, a first block BLK1 and a second block BLK2 are illustrated in FIG. 3.

A gate stack isolation insulating layer WL1 filling inside of the gate stack isolation openings WLH may be on the common source plate 110. The gate stack isolation insulating layer WL1 may include a silicon oxide film, a silicon nitride film, SiON, SiOCN, SiCN, or a combination thereof.

A plurality of channel structures 140 may extend in a vertical direction (Z direction) and pass through the plurality of gate electrodes 130 and the plurality of mold insulating layers 132 from the upper surface of the common source plate 110 on the memory cell region MCR. The plurality of channel structures 140 may be spaced apart from each other at predetermined intervals in the first horizontal direction (X direction), the second horizontal direction (Y direction), and the third horizontal direction (e.g., diagonal direction). The plurality of channel structures 140 may be arranged in a zigzag shape or staggered shape.

Each of the plurality of channel structures 140 may be in a channel hole 140H on the memory cell region MCR. Each of the plurality of channel structures 140 may include a gate insulating layer 142, a channel layer 144, a buried insulating layer 146, and a conductive plug 148. A gate insulating layer 142 and a channel layer 144 may be sequentially arranged on a sidewall of the channel hole 140H. For example, the gate insulating layer 142 may be conformally arranged on the sidewall of the channel hole 140H, and the channel layer 144 may be conformally arranged on the sidewall and a bottom of the channel hole 140H. A filling insulating layer 146 filling a remaining space of the channel hole 140H may be on the channel layer 144. A conductive plug 148 that contacts the channel layer 144 and blocks an entrance of the channel hole 140H may be in an upper portion of the channel hole 140H. In other embodiments, the filling insulating layer 146 may be omitted, and the channel layer 144 may be formed in a pillar shape to fill the remaining portion of the channel hole 140H.

In some embodiments, the channel layer 144 may contact the upper surface of the common source plate 110 at the bottom of the channel hole 140H. In some examples, as shown in FIG. 5, the bottom surface of the channel layer 144 may be at a lower vertical level than the upper surface of the common source plate 110, but is not limited thereto.

As shown in FIG. 8, the gate insulating layer 142 may have a structure in which a tunneling dielectric film 142A, a charge storage film 142B, and a blocking dielectric film 142C are sequentially included on an outer wall of the channel layer 144. Relative thicknesses of the tunneling dielectric film 142A, the charge storage film 142B, and the blocking dielectric film 142C constituting the gate insulating layer 142 are not limited to those illustrated in FIG. 8 and may be variously modified.

The tunneling dielectric film 142A may include silicon oxide, hafnium oxide, aluminum oxide, zirconium oxide, tantalum oxide, or the like. The charge storage film 142B is a region in which electrons passing through the tunneling dielectric film 142A from the channel layer 144 may be stored, and may include silicon nitride, boron nitride, silicon boron nitride, or polysilicon doped with an impurity. The blocking dielectric film 142C may include silicon oxide, silicon nitride, or a metal oxide having a higher permittivity than silicon oxide. The metal oxide may include hafnium oxide, aluminum oxide, zirconium oxide, tantalum oxide, or a combination thereof.

In some embodiments, a dielectric liner 149 may be interposed between the channel structure 140 and the gate electrode 130. For example, the dielectric liner 149 may be between the channel structure 140 and the gate electrode 130 and on upper and lower surfaces of the gate electrode 130. For example, and as shown in FIG. 7, the dielectric liner 149 may be between conductive barrier layer 130B and gate insulating layer 142 and between conductive barrier layer 130B and the mold insulating layer 132. In some embodiments, the dielectric liner 149 may include silicon oxide, silicon nitride, or a metal oxide having a higher permittivity than silicon oxide. The metal oxide may include hafnium oxide, aluminum oxide, zirconium oxide, tantalum oxide, or a combination thereof.

In one of block BLK1 or BLK2, the uppermost two gate electrodes 130 may be separated into two portions in a plan view by a string isolation opening SSLH. A string isolation insulating layer SSLI may be in the string isolation opening SSLH, and the two portions may be spaced apart from each other in the second horizontal direction Y with the string isolation insulating layer SSLI therebetween. The two portions may operate as the string select line SSL described with reference to FIG. 2.

The gate electrode 130 may include a first gate electrode 130S and a second gate electrode 130NS. The first gate electrode 130S and the second gate electrode 130NS may be determined from a relationship between the gate electrode 130 and a cell contact 160. Specifically, for one cell contact 160, one gate electrode connected to the corresponding cell contact 160 is referred to as a first gate electrode 130S, and one or more gate electrodes not connected to the corresponding cell contact 160 may be referred to as a second gate electrode 130NS. The second gate electrode 130NS may be connected to another cell contact 160, and thus, may be referred to as a first gate electrode 130S in relation to the other cell contact 160. In the present specification, the first gate electrode 130S and the second gate electrode 130NS based on the cell contact 160 of the CX1 region of FIG. 5 will be described.

On the connection region CON, the plurality of gate electrodes 130 may form a pad structure PAD. In the connection region CON, the plurality of gate electrodes 130 may extend to have shorter lengths in the first horizontal direction X as they move away from the upper surface of the common source plate 110. The pad structure PAD may refer to portions of the gate electrode 130 in a step shape. The pad structure PAD may include a plurality of pad portions 130P extending from each of the plurality of gate electrodes 130 and a plurality of connection portions 130C between the plurality of pad portions 130P and the cell contact 160. A detailed description of the pad portions 130P and the connection portions 130C will be provided later.

A cover insulating layer 134 may be on the pad structure PAD, and a first upper insulating layer 136 may be on the uppermost mold insulating layer 132 and the cover insulating layer 134.

The cell contact 160 penetrating the first upper insulating layer 136, the cover insulating layer 134, the plurality of gate electrodes 130, and the plurality of mold insulating layers 132 is on the connection region CON. The cell contact 160 may be inside the hole 160H penetrating the first upper insulating layer 136, the cover insulating layer 134, the plurality of gate electrodes 130, the plurality of mold insulating layers 132, and the insulating plug 120.

The cell contact 160 may include a buried conductive layer (not shown) penetrating the plurality of gate electrodes 130 and extending in the vertical direction Z, and a conductive barrier layer (not shown) surrounding side and bottom surfaces of the buried conductive layer. For example, the buried conductive layer may include a metal, such as tungsten, nickel, cobalt, tantalum, a metal silicide, such as tungsten silicide, nickel silicide, cobalt silicide, tantalum silicide, doped polysilicon, or combinations thereof. In some embodiments, the conductive barrier layer may include titanium nitride, tantalum nitride, tungsten nitride, or a combination thereof.

The cell contact 160 may be electrically connected to the corresponding first gate electrode 130S, and may be spaced apart from the at least one gate electrode 130 at a vertical level lower than the first gate electrode 130S among the plurality of gate electrodes 130. The cell contact 160 may be spaced apart from the second gate electrode 130NS. The cell contact 160 may not be electrically connected to the second gate electrode 130NS.

Referring to FIG. 7 in detail, the first gate electrode 130S may include an extension portion 130E extending on the memory cell region MCR, the pad portion 130P, and the connection portion 130C, and the first gate electrode 130S may be electrically connected to the cell contact 160 through the pad portion 130P and the connection portion 130C. For example, a connection sidewall portion 160_S1 of the cell contact 160 may contact the connection portion 130C. For example, the connection sidewall portion 160_S1 of the cell contact 160 may be electrically connected to the first gate electrode 130S through the pad portion 130P and the connection portion 130C.

In some embodiments, a vertical thickness T2 of the pad portion 130P may be greater than a vertical thickness T1 of the remaining portion of the first gate electrode 130S excluding the pad portion 130P and the connection portion 130C. That is, the vertical thickness T2 of the pad portion 130P may be greater than the vertical thickness T1 of the extension portion 130E. The vertical thickness T2 of the pad portion 130P may be greater than a vertical thickness T3 of the connection portion 130C. Specifically, the vertical thickness T2 of the pad portion 130P may be about twice or more than the vertical thickness T3 of the connection portion 130C. Specifically, the vertical thickness T2 of the pad portion 130P may be about twice or more than the vertical thickness T1 of the extension portion 130E.

In some embodiments, the vertical thickness T3 of the connection portion 130C may be equal to or greater than the vertical thickness T1 of the extension portion 130E.

In some embodiments, the vertical thickness T1 of the extension portion 130E may be substantially equal to a vertical thickness T4 of the second gate electrode 130NS. Because the second gate electrode 130NS may function as the first gate electrode 130S in relation to the other cell contact 160, the gate electrode 130 may have substantially the same thickness in portions other than the pad portion 130P and the connection portion 130S.

In some embodiments, the connection portion 130C may include a first surface 130C_1 and a second surface 130C_2 parallel to the extending direction of the gate electrode 130. The first surface 130C_1 of the connection portion 130C may be spaced apart from the second gate electrode 130NS with the second surface 130C_2 of the connection portion 130C therebetween. The second surface 130C_2 of the connection portion 130C may include a portion between the first surface 130C_1 of the connection portion 130C and the second gate electrode 130NS. The first surface 130C_1 of the connection portion 130C may correspond to an upper surface of the connection portion 130C, and the second surface 130C_2 of the connection portion 130C may correspond to a lower surface of the connection portion 130C. That is, the first surface 130C_1 of the connection portion 130C may correspond to an upper surface, a vertical level of which is higher than the second surface 130C_2 of the connection portion 130C.

In some embodiments, the pad portion 130P may include a sidewall 130P_S that does not overlap with the connection portion 130C in a horizontal direction. The sidewall 130P_S of the pad portion 130P may extend obliquely to the vertical direction (Z direction). The sidewall 130P_S of the pad portion 130P may extend in an oblique direction (D direction) forming an acute angle with the vertical direction (Z direction). The sidewall 130P_S of the pad portion 130P may extend in an oblique direction (direction D) forming at an angle other than perpendicular to the first horizontal direction (X direction) and the second horizontal direction (Y direction). The sidewall 130P_S of the pad portion 130P may extend in an extending direction of the cell contact 160, that is, in an oblique direction (D direction) forming an acute angle with the vertical direction (Z direction). The sidewall 130P_S of the pad portion 130P may include a first sidewall 130P_S1 meeting the first surface 130C_1 of the connection portion 130C at an obtuse angle and a second sidewall 130P_S2 meeting the second surface 130C_2 of the connection portion 130C at an acute angle. The first sidewall 130P_S1 of the pad portion 130P may be positioned at a higher vertical level than the second sidewall 130P_S2 of the pad portion 130P. The first sidewall 130P_S1 of the pad portion 130P may be spaced apart from the second gate electrode 130NS with the second sidewall 130P_S2 of the pad portion 130P therebetween. A separation distance between the cell contact 160 and the first sidewall 130P_S1 of the pad portion 130P may be greater than a separation distance between the cell contact 160 and the second sidewall 130P_S2 of the pad portion 130P.

In some embodiments, one or more first insulating rings 162 may be between the connection portion 130C and the mold insulating layer 132. The one or more first insulating rings 162 may surround the cell contact 160. The one or more first insulating rings 162 may have a ring shape or a donut shape. Specifically, the one or more first insulating rings 162 may include a first upper insulating ring 162a between the connection portion 130C and the cover insulating layer 134 and a first lower insulating ring 162b between the connection portion 130C and the mold insulating layer 132. The first upper insulating ring 162a may be on the first surface 130C_1 of the connection portion 130C and the first lower insulating ring 162b may be on the second surface 130C_2 of the connection portion 130C. The first upper insulating ring 162a may be on the first sidewall 130P_S1 of the pad portion 130P and the first lower insulating ring 162b may be on the second sidewall 130P_S2 of the pad portion 130P. That is, the first upper insulating ring 162a may be on the first surface 130C_1 of the connection portion 130C and the first sidewall 130P_S1 of the pad portion 130P, and the first lower insulating ring 162b may be on the second surface 130C_2 of the connection portion 130C and the second sidewall 130P_S2 of the pad portion 130P. Furthermore, the first upper insulating ring 162a may be positioned at a higher vertical level than the first lower insulating ring 162b. That is, the first upper insulating ring 162a may be spaced apart from the second gate electrode 130NS with the first lower insulating ring 162b therebetween. The first lower insulating ring 162b may include a portion between the first upper insulating ring 162a and the second gate electrode 130NS.

In some embodiments, a horizontal length L1 of the first upper insulating ring 162a may be greater than a horizontal length L2 of the first lower insulating ring 162b. In some embodiments, the first upper insulating ring 162a and the first lower insulating ring 162b may have non-constant horizontal lengths in a vertical direction (Z direction). For example, an average of horizontal lengths of the first upper insulating ring 162a may be greater than an average of horizontal lengths of the first lower insulating ring 162b. As another example, a horizontal length of the first upper insulating ring 162a at the middle vertical level may be greater than a horizontal length of the first lower insulating ring 162b at the middle vertical level. As an additional example, the horizontal length of all vertical levels of the first upper insulating ring 162a may be greater than the horizontal length of all vertical levels of the first lower insulating ring 162b. As yet another example, the minimum horizontal length of the first upper insulating ring 162a may be greater than the maximum horizontal length of the first lower insulating ring 162b.

Referring to FIG. 7, the second gate electrode 130NS may be spaced apart from the cell contact 160 with the second insulating ring 164 therebetween. The second insulating ring 164 may surround the cell contact 160. The second insulating ring 164 may have a ring shape or a donut shape. The second gate electrode 130NS may not be electrically connected to the cell contact 160 by the second insulating ring 164. For example, the unconnected sidewall portion 160_S2 of the cell contact 160 may not be electrically connected to the second gate electrode 130NS. As another example, the unconnected sidewall portion 160_S2 of the cell contact 160 may be spaced apart from the second gate electrode 130NS with the second insulating ring 164 therebetween. As an additional example, the unconnected sidewall portion 160_S2 of the cell contact 160 may be electrically insulated from the second gate electrode 130NS by the second insulating ring 164.

In some embodiments, a horizontal length L3 of the second insulating ring 164 may be less than the horizontal length of the one or more first insulating rings 162. Specifically, the horizontal length L3 of the second insulating ring 164 may be less than the horizontal length L1 of the first upper insulating ring 162a and the horizontal length L2 of the first lower insulating ring 162b. For example, the horizontal length L3 of the second insulating ring 164 may be less than the average of the horizontal lengths of the first upper insulating ring 162a and the average of the horizontal lengths of the first lower insulating ring 162b. As another example, the horizontal length L3 of the second insulating ring 164 may be less than the horizontal length at the middle vertical level of the first upper insulating ring 162a and the horizontal length at the middle vertical level of the first lower insulating ring 162b. As an additional example, the horizontal length L3 of the second insulating ring 164 may be less than the horizontal length at all vertical levels of the first upper insulating ring 162a and the horizontal length at all vertical levels of the first lower insulating ring 162b. As yet another example, the horizontal length L3 of the second insulating ring 164 may be less than the minimum horizontal length of the first upper insulating ring 162a and/or the minimum horizontal length of the first lower insulating ring 162b.

In some embodiments, a horizontal length L4 of the connection portion 130C of the first gate electrode 130S may be greater than the horizontal length L3 of the second insulating ring 164. In some embodiments, the connection portion 130C may have an irregular horizontal length in the vertical direction (Z direction). For example, an average of horizontal lengths of the connection portion 130C may be greater than the horizontal length L3 of the second insulating ring 164. As another example, the horizontal length of the connection portion 130C at a middle vertical level may be greater than the horizontal length L3 of the second insulating ring 164. As an additional example, the horizontal length of all vertical levels of the connection portion 130C may be greater than the horizontal length L3 of the second insulating ring 164. As yet another example, a minimum horizontal length of the connection portion 130C may be greater than the horizontal length L3 of the second insulating ring 164.

In some embodiments, the connection portion 130C may include sub-portions that do not overlap with the second insulating ring 164 in the vertical direction (Z direction). For example, a sub-portion of the connection portion 130C that does not contact the cell contact 160 may not overlap the second insulating ring 164 in the vertical direction (Z direction). As another example, a sub-portion of the connection portion 130C that contacts the pad portion 130P may not overlap the second insulating ring 164 in the vertical direction (Z direction).

In some embodiments, the one or more first insulating rings 162 may include a portion that does not overlap with the second insulating ring 164 in the vertical direction (Z direction). Specifically, the first upper insulating ring 162a and/or the first lower insulating ring 162b may include a portion that does not overlap with the second insulating ring 164 in the vertical direction (Z direction). For example, a portion of the first insulating ring 162 that does not contact the cell contact 160 may not overlap the second insulating ring 164 in the vertical direction (Z direction). As another example, a portion of the first upper insulating ring 162a and/or the first lower insulating ring 162b that does not contact the cell contact 160 may not overlap the second insulating ring 164 in the vertical direction (Z direction). As yet another example, portions of the first insulating ring 162 on the sidewalls 130P_S1 and 130P_S2 of the pad portion 130P may not overlap with the second insulating ring 164 in the vertical direction (Z direction). As an additional example, a portion of the first upper insulating ring 162a on the first sidewall 130P_S1 of the pad portion 130P may not overlap with the second insulating ring 164 in the vertical direction (Z direction). As a further example, a portion of the first lower insulating ring 162b on the second sidewall 130P_S2 of the pad portion 130P may not overlap with the second insulating ring 164 in the vertical direction (Z direction).

In some embodiments, the pad portion 130P of the first gate electrode 130S may not overlap the second insulating ring 164 in the vertical direction (Z direction). In some embodiments, the connection portion 130C of the first gate electrode 130S may include a portion overlapping the second gate electrode 130NS in the vertical direction (Z direction). For example, a portion of the connection portion 130C that does not overlap with the second insulating ring 164 in the vertical direction (Z direction) may include a portion that overlaps with the second gate electrode 130NS in the vertical direction (Z direction). In some embodiments, the second gate electrode 130NS may include a portion that does not overlap with the pad portion 130P in the vertical direction (Z direction).

Referring to FIG. 7, the dielectric liner 149 may be between the gate electrode 130 and the mold insulating layer 132. Specifically, the dielectric liner 149 may be between the gate electrode 130 and the mold insulating layer 132 and between the gate electrode 130 and the cover insulating layer 134. For example, the dielectric liner 149 may be on upper and lower surfaces of the gate electrode 130.

In some embodiments, the dielectric liner 149 may be between the first gate electrode 130S and the mold insulating layer 132 and between the first gate electrode 130S and the cover insulating layer 134. Specifically, the dielectric liner 149 may be on upper and lower surfaces of the first gate electrode 130S. For example, the dielectric liner 149 may be on an upper surface 130P_T, a lower surface 130P_B, and a sidewall 130P_S of the pad portion 130P. As another example, the dielectric liner 149 may be on the first surface 130C_1 and the second surface 130C_2 of the connection portion 130C. That is, the dielectric liner 149 may be between the upper surface 130P_T and the first sidewall 130P_S1 of the pad portion 130P and the cover insulating layer 134. Moreover, the dielectric liner 149 may be between the lower surface 130P_B and the second sidewall 130P_S2 of the pad portion 130P and the mold insulating layer 132. The dielectric liner 149 may be between the first surface 130C_1 of the connection portion 130C and the cover insulating layer 134. The dielectric liner 149 may be between the second surface 130C_2 of the connection portion 130C and the mold insulating layer 132.

The first gate electrode 130S may be spaced apart from the mold insulating layer 132 and the cover insulating layer 134 with the dielectric liner 149 therebetween. The pad portion 130P may be spaced apart from the mold insulating layer 132 and the cover insulating layer 134 with the dielectric liner 149 therebetween. The connection portion 130C may be spaced apart from the mold insulating layer 132 and the cover insulating layer 134 with the dielectric liner 149 therebetween.

In some embodiments, the dielectric liner 149 may be between the connection portion 130C of the first gate electrode 130S and the one or more first insulating rings 162. Specifically, the dielectric liner 149 may be between the connection portion 130C and the first upper insulating ring 162a and between the connection portion 130C and the first lower insulating ring 162b. That is, the connection portion 130C may be spaced apart from the first insulating ring 162 with the dielectric liner 149 therebetween.

In some embodiments, the dielectric liner 149 may be between the pad portion 130P of the first gate electrode 130S and the one or more first insulating rings 162. Specifically, the dielectric liner 149 may be between the pad portion 130P and the first upper insulating ring 162a and between the pad portion 130P and the first lower insulating ring 162b. That is, the pad portion 130P may be spaced apart from the one or more first insulating rings 162 with the dielectric liner 149 therebetween.

In some embodiments, the dielectric liner 149 may be between the second gate electrode 130NS and the mold insulating layer 132 and between the second gate electrode 130NS and the second insulating ring 164. That is, the second gate electrode 130NS may be spaced apart from the mold insulating layer 132 and the second insulating ring 164 with the dielectric liner 149 therebetween.

In some embodiments, the dielectric liner 149 may include a first portion 149_1 between the connection portion 130C and the one or more first insulating rings 162 on the first gate electrode 130S. The first portion 149_1 may be on the first surface 130C_1 and the second surface 130C_2 of the connection portion 130C. A horizontal length of the first portion 149_1 of the dielectric liner 149 may be greater than the horizontal length L3 of the second insulating ring 164. The first portion 149_1 of the dielectric liner 149 may include a sub-portion that does not overlap with the second insulating ring 164 in the vertical direction (Z direction). The first portion 149_1 of the dielectric liner 149 may include a sub-portion overlapping the second gate electrode 130NS in the vertical direction (Z direction). The first portion 149_1 of the dielectric liner 149 may contact the one or more first insulating rings 162.

In some embodiments, the dielectric liner 149 may include a second portion 149_2 on an upper surface 130P_T and a lower surface 130P_B of the pad portion 130P on the first gate electrode 130S. The second portion 149_2 may be between the upper surface 130P_T of the pad portion 130P and the cover insulating layer 134 and between the lower surface 130P_B of the pad portion 130P and the mold insulating layer 132. The second portion 149_2 of the dielectric liner 149 may not overlap the second insulating ring 164 in the vertical direction (Z direction).

In some embodiments, the dielectric liner 149 may be between the pad portion 130P and the one or more first insulating rings 162 on the first gate electrode 130S, and may include a third portion 149_3 that is not parallel to the gate electrode 130. The third portion 149_3 may be on a sidewall 130P_S of the pad portion 130P. For example, the third portion 149_3 may be on a first sidewall 130P_S1 and/or a second sidewall 130P_S2 of the pad portion 130P. That is, the third portion 149_3 is formed between the first sidewall 130P_S1 of the pad portion 130P and the first upper insulating ring 162a and between the second sidewall 130P_S2 of the pad portion 130P and the first lower insulating ring 162b. The third portion 149_3 of the dielectric liner 149 may not overlap the second insulating ring 164 in the vertical direction (Z direction). The third portion 149_3 of the dielectric liner 149 may contact the one or more first insulating rings 162.

In some embodiments, the dielectric liner 149 and the one or more first insulating rings 162 are on the connection portion 130C that is directly connected to the cell contact 160. As such, the insulation performance between the gate electrodes 130NS and the first gate electrode 130S may be improved. Accordingly, a failure of electrical connection between the second gate electrode 130NS and the cell contact 160 may be reduced or inhibited. That is, a non-volatile memory device with improved performance and reliability may be provided, and/or an electronic system with improved performance and reliability may be provided.

Referring again to FIGS. 3 to 8, a bottom portion of the cell contact 160 may be surrounded by a first conductive landing via 90, and the first conductive landing via 90 may be covered by the interlayer insulating film 80. A bottom surface of the first conductive landing via 90 may contact an upper surface of the peripheral circuit wiring layer 74. The first conductive landing via 90 may be polysilicon doped with an n-type impurity.

Although not shown, a plurality of dummy channel structures extending from the upper surface of the common source plate 110 through the plurality of gate electrodes 130 and the plurality of mold insulating layers 132 may further be formed in the connection region CON. The dummy channel structures may be formed to prevent leaning or bending of the gate electrode 130 and to improve structural stability during a manufacturing process of the non-volatile memory device 100. Each of the plurality of dummy channel structures may have a structure and shape similar to the shape/structure of the plurality of channel structures 140.

A through hole 170H passing through the insulating plug 120, the cover insulating layer 134, and the first upper insulating layer 136 may be on the peripheral circuit connection region PRC, and a conductive through via 170 may be within the through hole 170H. For example, the conductive through via 170 may include tungsten, titanium, tantalum, copper, aluminum, titanium nitride, tantalum nitride, tungsten nitride, or a combination thereof.

A second conductive landing via 92 may surround a lower sidewall of the conductive through via 170 and may be covered by the interlayer insulating film 80. A bottom surface of the second conductive landing via 92 may contact an upper surface of the peripheral circuit wiring layer 74. The second conductive landing via 92 may be polysilicon doped with an n-type impurity.

As an example and referring to FIG. 5, the second conductive landing via 92 surrounds the lower sidewall of the conductive through via 170 and a bottom surface of the conductive through via 170 contacts the upper surface of the peripheral circuit wiring layer 74. In one variation, the bottom surface of the conductive through via 170 may be in contact with an upper surface of the second conductive landing via 92, and a bottom surface of the second conductive landing via 92 may be in contact with upper surface of the peripheral circuit wiring layer 74.

The cell contact 160 may be connected to the peripheral circuit transistor 60TR through the first conductive landing via 90 and the peripheral circuit wiring layer 74, and the conductive through via 170 may be connected to the peripheral circuit transistor 60TR through the second conductive landing via 92 and the peripheral circuit wiring layer 74.

On the memory cell region MCR, a bit line contact BLC may contact the conductive plug 148 of the channel structure 140 through the first upper insulating layer 136, and the bit line BL may be on the bit line contact BLC. A second upper insulating layer 138 covering sidewalls of the bit lines BL may be on the first upper insulating layer 136. A wiring line ML1 may be on the conductive through via 170 in the peripheral circuit connection region PRC.

Figure 9:
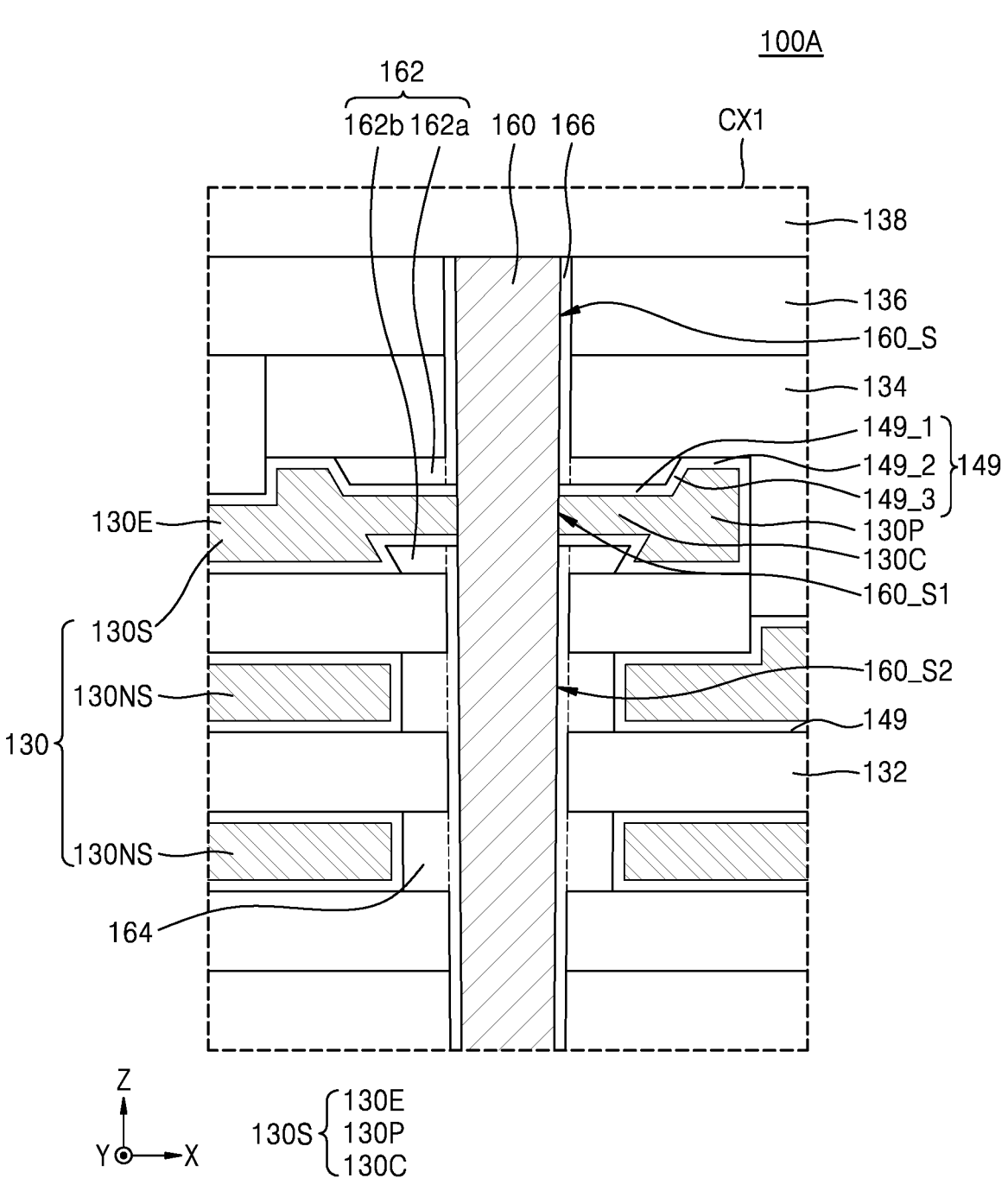
FIG. 9 is a cross-sectional view illustrating a non-volatile memory device according to embodiments of the present disclosure.

FIG. 9 is a cross-sectional view illustrating a non-volatile memory device 100A according to embodiments of the present disclosure. FIG. 9 is a cross-sectional view corresponding to the enlarged cross-sectional view of the CX1 portion of FIG. 5. In FIG. 9, like reference numerals as in FIGS. 1 to 8 denote like components. Differences between the non-volatile memory device 100A shown in FIG. 9 and the non-volatile memory device 100 of FIGS. 3 to 8 will be mainly described.

Referring to FIG. 9, the non-volatile memory device 100A may further include an insulating liner 166 on a sidewall 160_S of the cell contact 160. The insulating liner 166 may be between the cell contact 160 and the plurality of mold insulating layers 132, between the cell contact 160 and the cover insulating layer 134, and between the cell contact 160 and the first upper insulating layer 136. The insulating liner 166 may be between the cell contact 160 and the plurality of second gate electrodes 130NS. The insulating liner 166 may be between the cell contact 160 and the pad portion 130P of the first gate electrode 130S. The insulating liner 166 may be between the cell contact 160 and the one or more first insulating rings 162 and between the cell contact 160 and the second insulating ring 164. The insulating liner 166 may be between the cell contact 160 and the first upper insulating ring 162a and between the cell contact 160 and the first lower insulating ring 162b. The insulating liner 166 may be integrally connected to the one or more first insulating rings 162 and the second insulating ring 164. The insulating liner 166 may be integrally connected to the first upper insulating ring 162a and the first lower insulating ring 162b. The one or more first insulating rings 162 and the second insulating ring 164 may be connected by the insulating liner 166. The first upper insulating ring 162a and the first lower insulating ring 162b may be connected by the insulating liner 166.

FIGS. 10 to 24 are cross-sectional views illustrating a method of manufacturing a non-volatile memory device according to embodiments. Specifically, FIGS. 10 to 14 are cross-sectional views corresponding to a cross-section taken along line A-A' of FIG. 4, and FIGS. 15 to 24 are cross-sectional views corresponding to a cross-section of the CX1 portion of FIG. 5.

Figure 10:
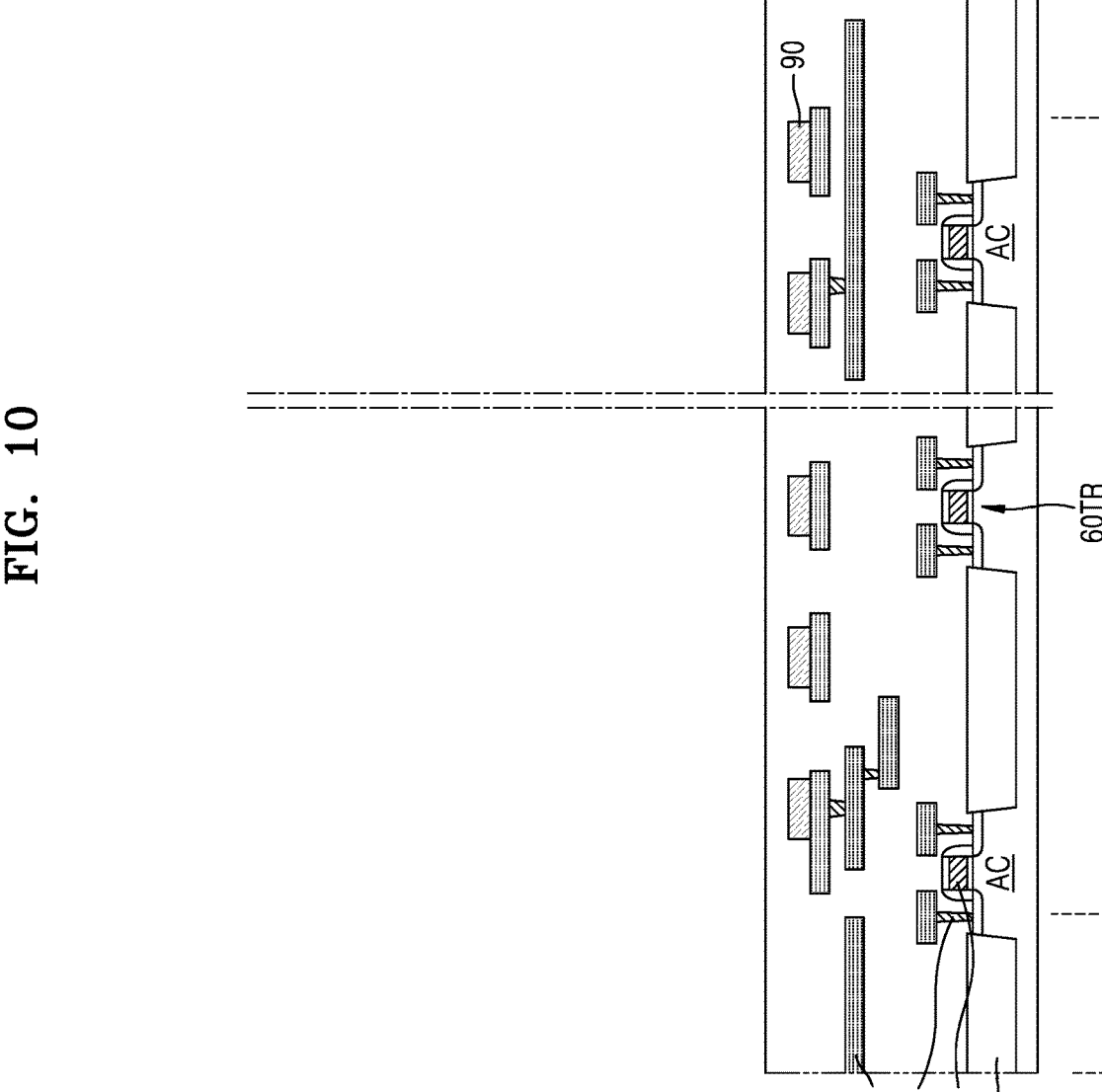

Referring to FIG. 10, a peripheral circuit structure PS may be formed on a substrate 50. In example embodiments, the substrate 50 may be a monocrystalline silicon substrate. A plurality of peripheral circuit transistors 60TR may be formed on the substrate 50, and a peripheral circuit wiring structure 70 and an interlayer insulating film 80 electrically connected to the peripheral circuit transistors 60TR may be formed.

On the peripheral circuit connection region PRC, first and second conductive landing vias 90 and 92 may further be formed on the uppermost peripheral circuit wiring layer 74. For example, the first and second conductive landing vias 90 and 92 may be formed to be polysilicon doped with an n-type impurity. Upper surfaces of the first and second conductive landing vias 90 and 92 may be covered by an interlayer insulating film 80.

Figure 11:
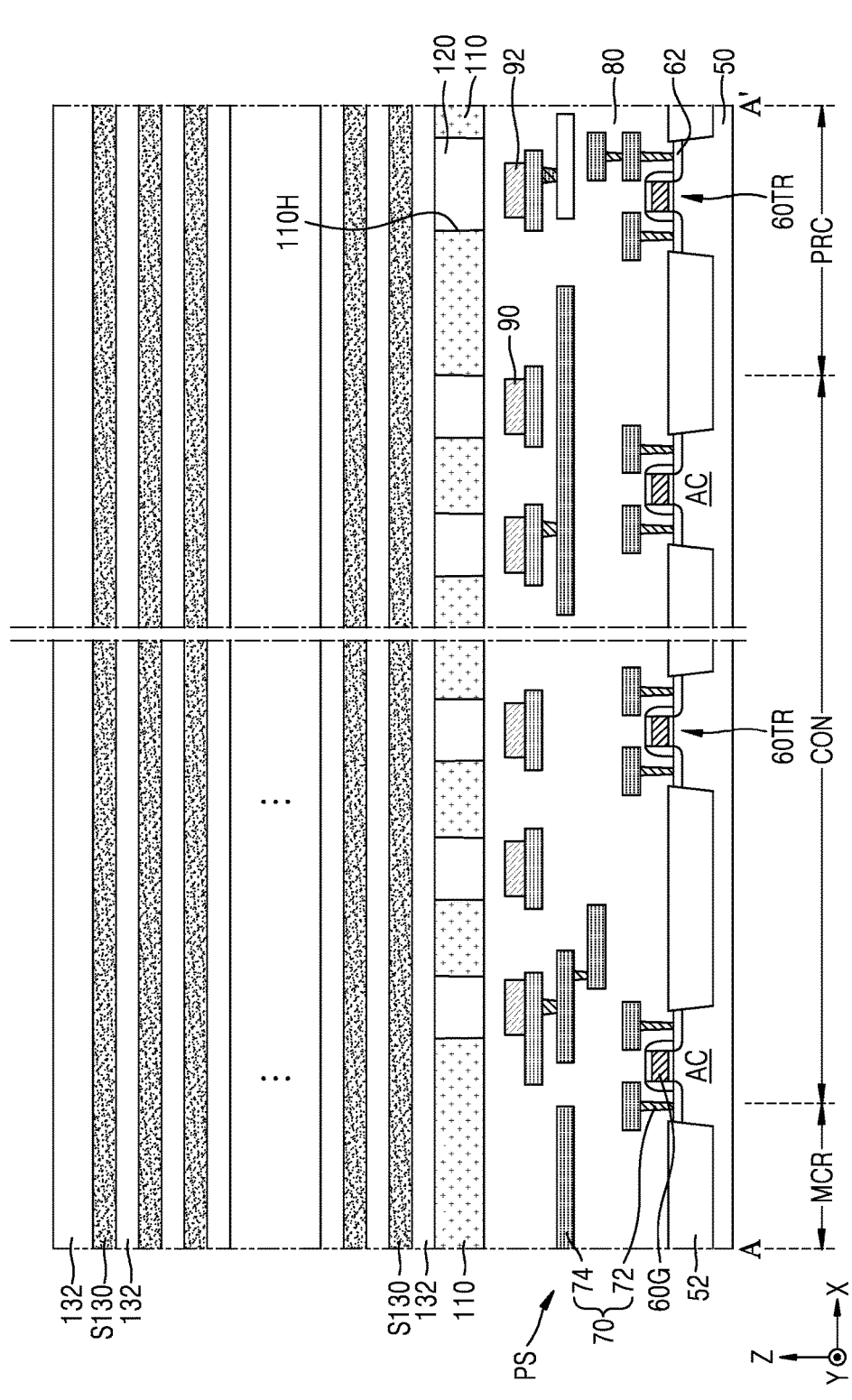

Referring to FIG. 11, a common source plate 110 may be formed on the interlayer insulating film 80. In some embodiments, the common source plate 110 may be formed using a semiconductor doped with an n-type impurity.

Afterwards, a mask pattern (not shown) may be formed on the common source plate 110, and an opening 110H may be formed by removing a portion of the common source plate 110 using the mask pattern as an etch mask. The opening 110H may be formed in a region vertically overlapping at least a portion of the connection region CON and the peripheral circuit connection region PRC.

Thereafter, an insulating layer (not shown) is formed on the common source plate 110 to fill the opening 110H, and an insulating plug 120 may be formed by planarizing an upper surface of the insulating layer until an upper surface of the common source plate 110 is exposed.

Thereafter, a plurality of mold insulating layers 132 and a plurality of sacrificial layers S130 may be alternately formed on the common source plate 110. In example embodiments, the plurality of mold insulating layers 132 may include an insulating material, such as silicon oxide or silicon oxynitride, and the plurality of sacrificial layers S130 may include silicon nitride, silicon oxynitride, or polysilicon doped with an impurity.

Figure 12:
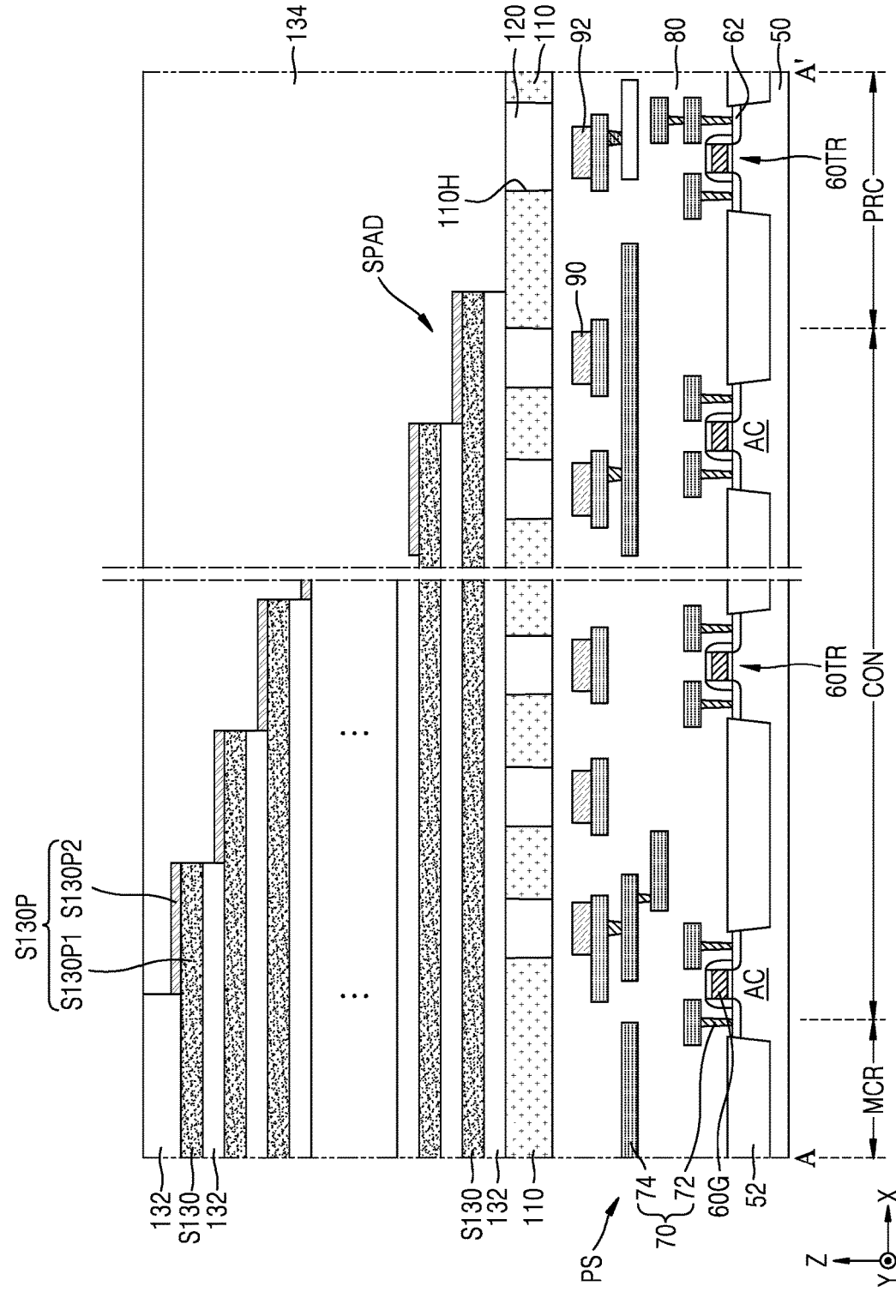

Referring to FIG. 12, a preliminary pad structure SPAD may be formed by sequentially patterning the plurality of mold insulating layers 132 and the plurality of sacrificial layers $130 on the connection region CON.

In some embodiments, the preliminary pad structure SPAD may be formed to have a step shape, which refers to an upper surface thereof having a level difference in the first horizontal direction (X direction) (refer to FIG. 4). For example, the preliminary pad structure SPAD may include a plurality of preliminary pad portions S130P, and each of the plurality of preliminary pad portions S130P may include a first preliminary pad layer S130P1 and a second preliminary pad layer S130P2.

In some embodiments, the first preliminary pad layer S130P1 may correspond to an end portion of the plurality of sacrificial layers S130, and thus, the first preliminary pad layer S130P1 may include the same first insulating material as the plurality of sacrificial layers S130. The second preliminary pad layer S130P2 may include a material having an etch selectivity with respect to the first preliminary pad layer S130P1.

For example, the first preliminary pad layer S130P1 and the second preliminary pad layer S130P2 may include at least one of silicon nitride, silicon oxynitride, silicon oxide, silicon carbide, SiOC, spin-on hard mask (SOH), and poly-silicon, but the material is not limited thereto. In some embodiments, the first preliminary pad layer S130P1 may include silicon nitride, and the second preliminary pad layer S130P2 may include silicon oxynitride.

Afterwards, a cover insulating layer 134 covering the preliminary pad structure SPAD may be formed. The cover insulating layer 134 may include an insulating material, such as silicon oxide or silicon oxynitride.

Figure 13:
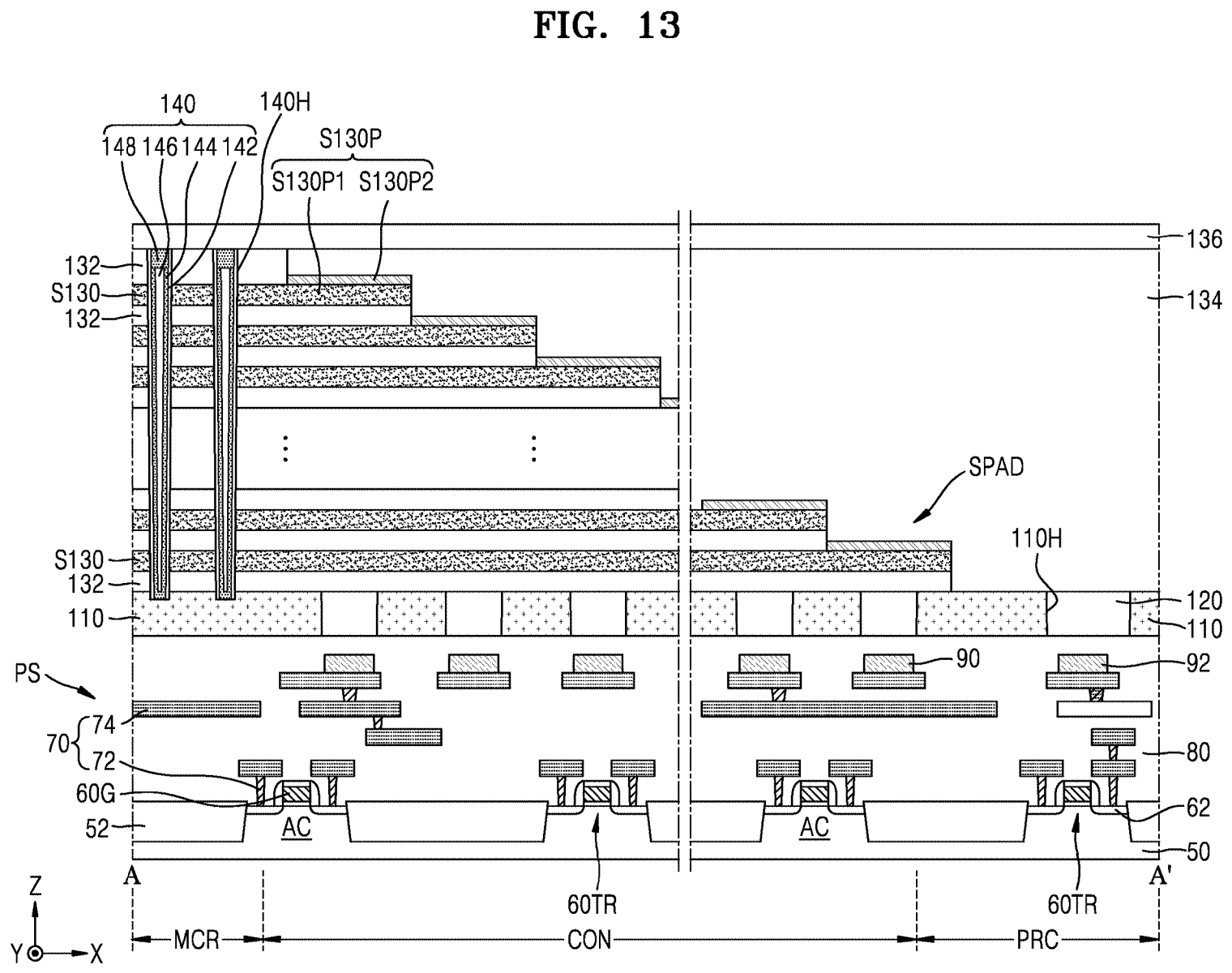

Referring to FIG. 13, a mask pattern (not shown) is formed on the uppermost mold insulating layer 132 and the cover insulating layer 134, and a channel hole 140H may be formed by patterning the plurality of mold insulating layers 132 and the plurality of sacrificial layers S130 using the mask pattern as an etching mask.

Thereafter, a channel structure 140 including a gate insulating layer 142, a channel layer 144, a buried insulating layer 146, and a conductive plug 148 may be formed on an inner wall of the channel hole 140H.

Although not shown, in a process of forming the channel structure 140, the dummy channel structure penetrating the preliminary pad structure SPAD may also be formed in the connection region CON.

Thereafter, a first upper insulating layer 136 covering the uppermost mold insulating layer 132, the cover insulating layer 134, and the channel structure 140 may be formed.

Figure 14:
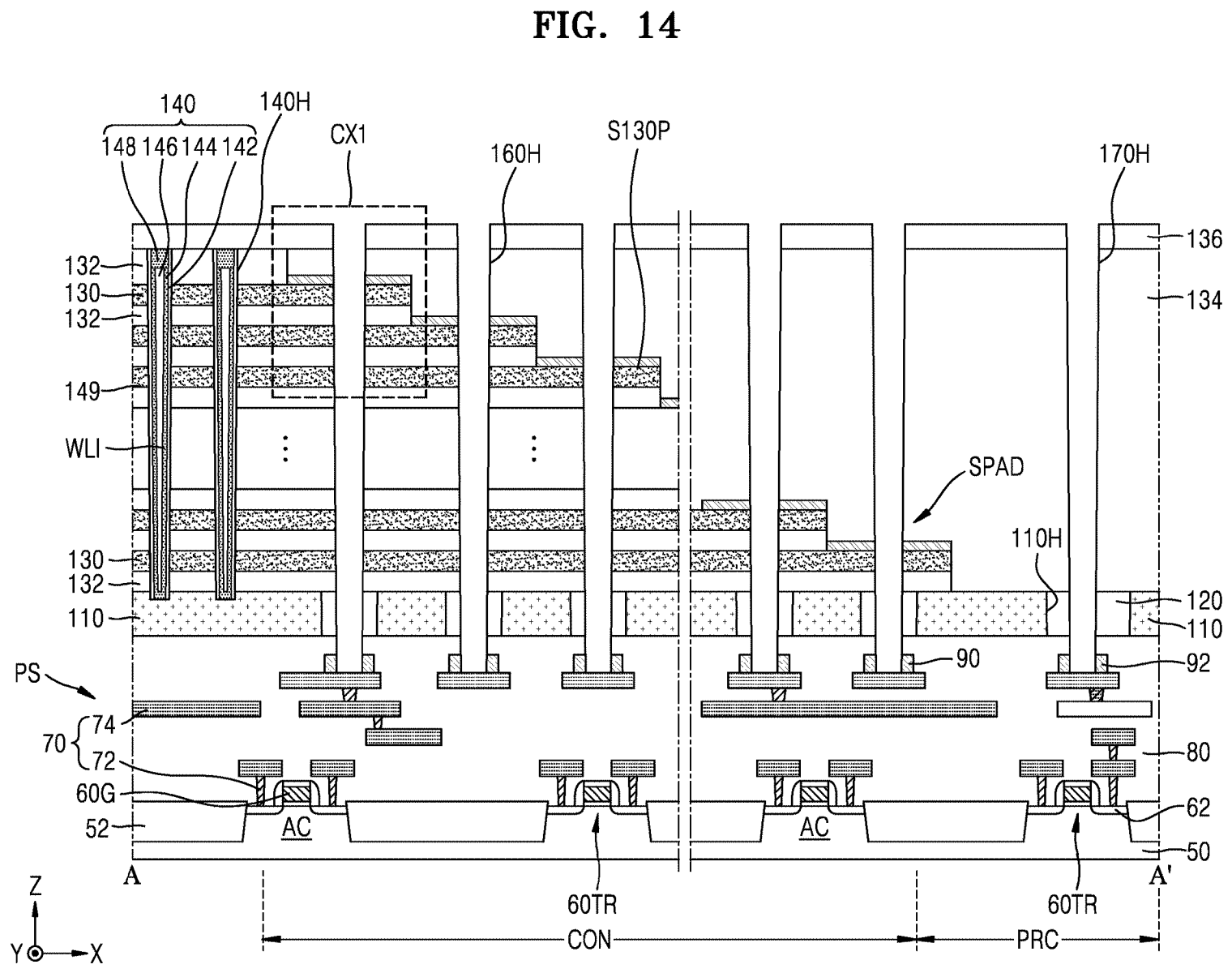

Referring to FIG. 14, a mask pattern (not shown) is formed on the first upper insulating layer 136 on the connection region CON, and cell contact holes 160H penetrating the first upper insulating layer 136, the preliminary pad structure SPAD, and the insulating plug 120 may be formed by using the mask pattern as an etch mask. In addition, a through hole 170H penetrating the first upper insulating layer 136, the cover insulating layer 134, and the insulating plug 120 is formed on the peripheral circuit connection region PRC by using the mask pattern as an etch mask.

In some embodiments, the cell contact hole 160H penetrates through the preliminary pad portion S130P, and may extend in the vertical direction (Z) passing through the plurality of sacrificial layers S130 and the plurality of mold insulating layers 132 at a vertical level lower than the preliminary pad portion S130P. The cell contact hole 160H may extend in a vertical direction (Z) from an upper surface of the first upper insulating layer 136 to a bottom surface of the insulating plug 120 and may extend into the interlayer insulating film 80 to expose an upper surface of the first conductive landing via 90.

Figure 15:
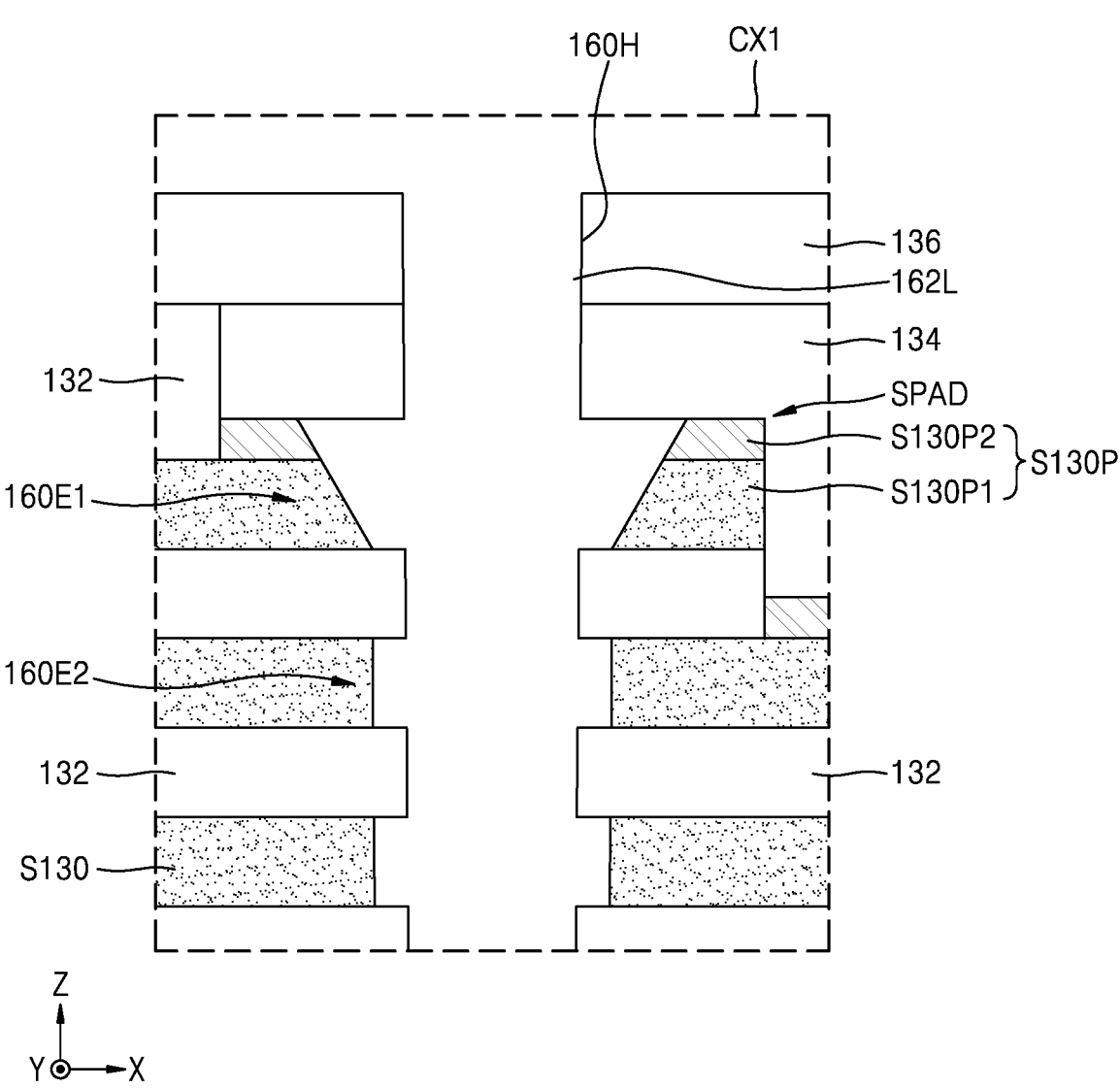
FIGS. 15, 16, 17, 18, 19, 20, 21, 22, 23, and 24 are cross-sectional views corresponding to the cross-section of the CX1 portion of FIG. 5.

Referring to FIG. 15, a first extension portion 160E1 may be formed by removing a portion of the preliminary pad portion S130P exposed on an inner wall of the cell contact hole 160H, and a second extension portion 160E2 may be formed on the inner wall of the cell contact hole 160H by removing a portion of the exposed sacrificial layer S130.

In some embodiments, a process of forming the first extension portion 160E1 and the second extension portion 160E2 may be an etching process using an etchant including phosphoric acid ($HPO_3$). For example, the first extension portion 160E1 may be formed to have a greater width than the second extension portion 160E2.

In some embodiments, in the process of forming the first extension portion 160E1, the first preliminary pad layer S130P1 and the second preliminary pad layer S130P2 may have different etch rates, and thus, the first extension portion 160E1 may be formed to have an inclined sidewall. For example, in the etching process, the second preliminary pad layer S130P2 may be removed at a higher etching rate than the first preliminary pad layer S130P1, and in this embodiment, the first extension portion 160E1 may have a shape having a positive slope so that an upper width is greater than a lower width.

In some embodiments, an inner wall of the first extension portion 160E1 may include the cover insulating layer 134, the first preliminary pad layer S130P1, and the second preliminary pad layer S130P2. In some embodiments, an inner wall of the second extension portion 160E2 may include the mold insulating layer 132 and the first preliminary pad layer S130P1.

Figure 16:
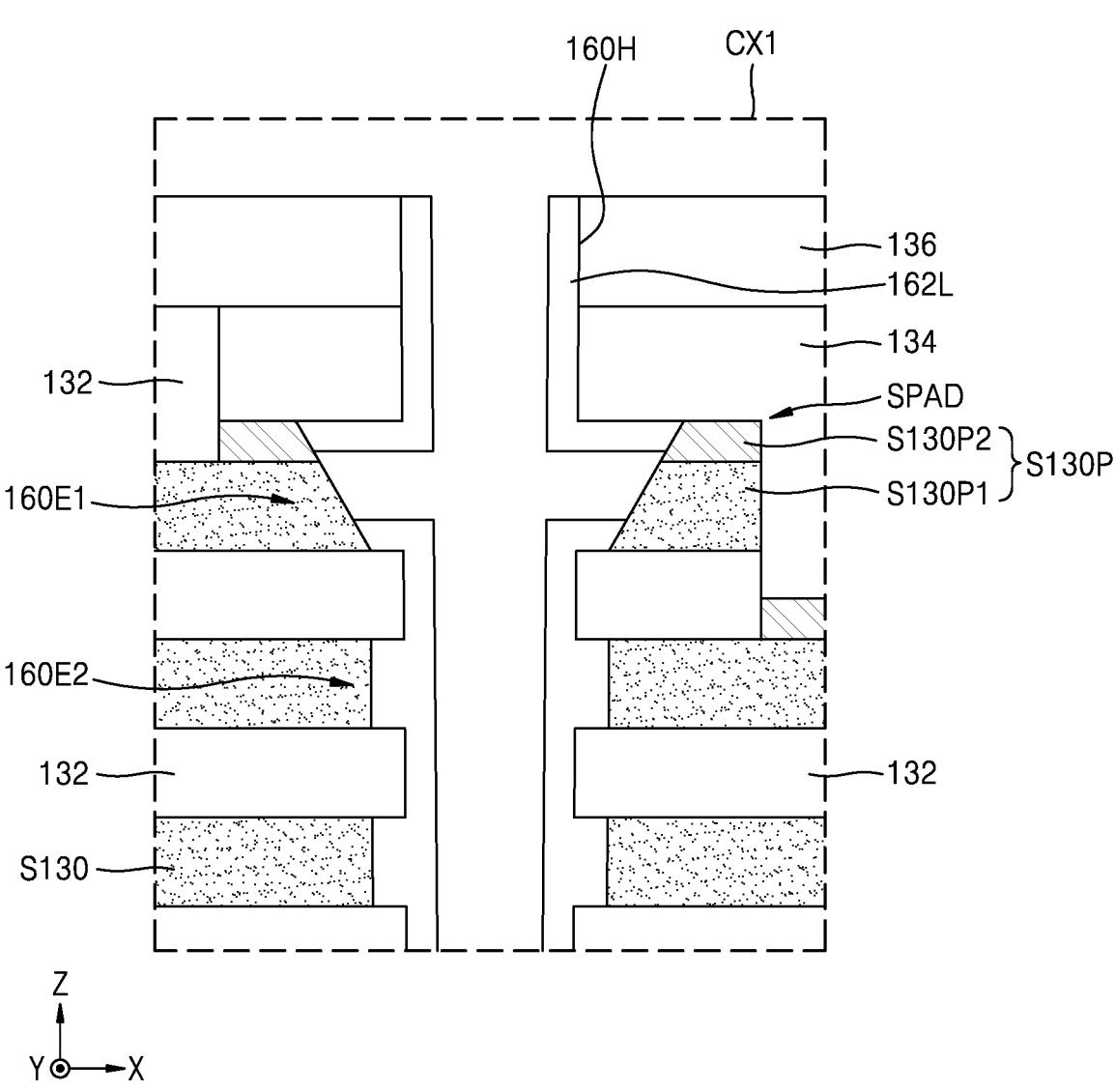

Referring to FIG. 16, an insulating liner 162L may be formed on an inner wall of the cell contact hole 160H. The insulating liner 162L may be conformally formed on some inner walls of the first extension portion 160E1 and the second extension portion 160E2. In some embodiments, the insulating liner 162L may be formed using silicon nitride.

In some embodiments, the insulating liner 162L may be conformally formed on the cover insulating layer 134 of the inner wall of the first extension portion 160E1. In some embodiments, the insulating liner 162L may not be formed on partial regions of the first preliminary pad layer S130P1 and the second preliminary pad layer S130P2 of the inner wall of the first extension portion 160E1. That is, the insulating liner 162L may be selectively formed only on silicon oxide and/or silicon oxynitride, and the insulating liner 162L may not be formed on silicon nitride. In some embodiments, when the second preliminary pad layer S130P2 includes silicon oxynitride, the insulating liner 162L may also be formed on a portion of the second preliminary pad layer S130P2. That is, the first extension portion 160E1 may not be completely filled with the insulating liner 162L and may include an empty space.

In some embodiments, a selective formation process of the insulating liner 162L may be performed by a low-temperature atomic layer deposition (ALD) process. For example, the selective formation process of the insulating liner 162L may be performed by an ALD process at a temperature in a range from about 150° C. to about 200° C., including endpoints.

In some embodiments, the insulating liner 162L may be conformally formed on the mold insulating layer 132 of the second expansion portion 160E2. In some embodiments, the insulating liner 162L may be repeatedly formed until it fills the second extension portion 160E2. Because a vertical width of the second extension portion 160E2 is less than a vertical width of the first extension portion 160E1, while the second extension portion 160E2 is filled with the insulating liner 162L, the first extension portion 160E1 may not be completely filled. In some embodiments, although not shown, the second extension portion 160E2 may not be completely filled with the insulating liner 162L and may form a seam.

Figure 17:
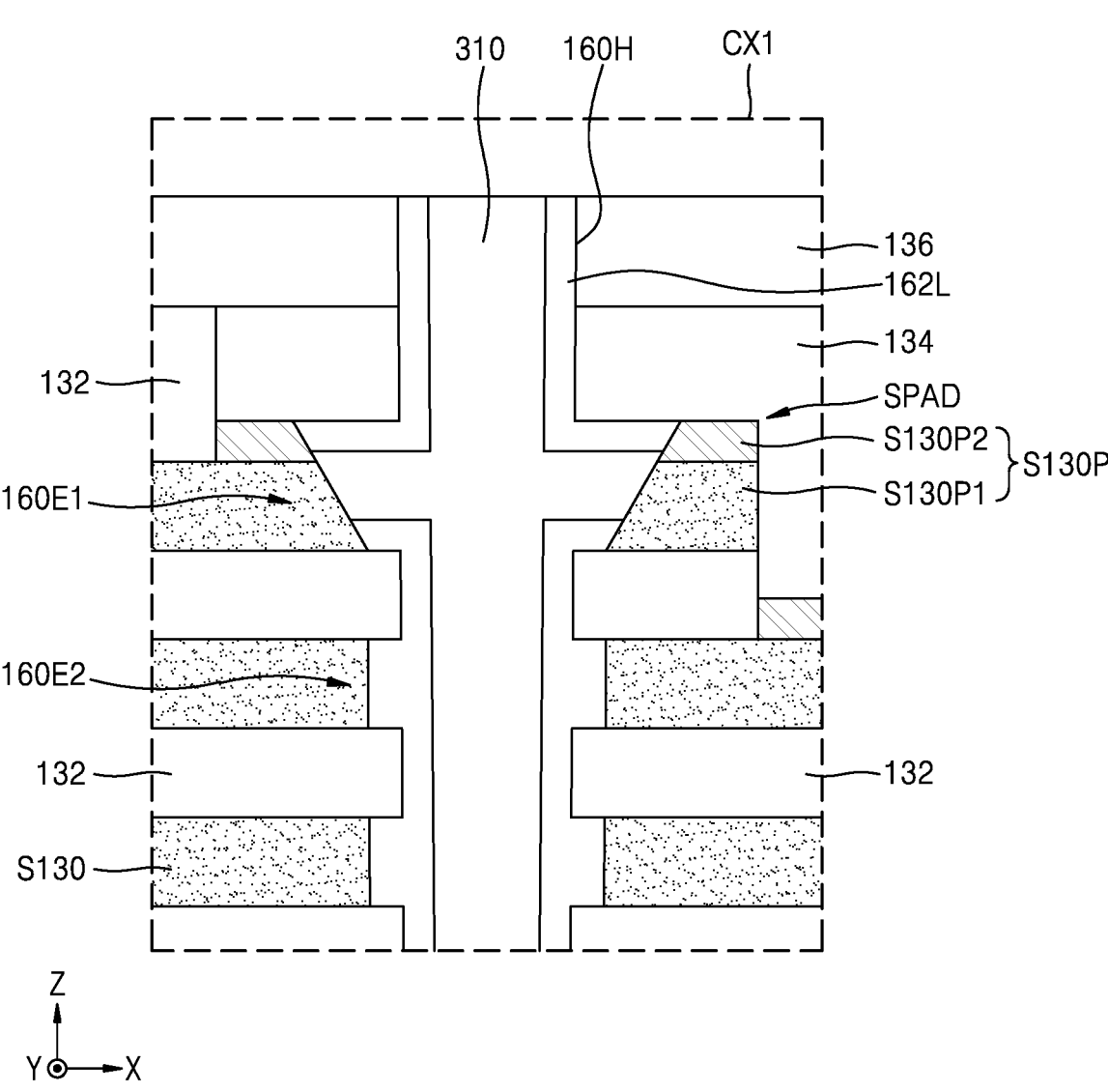

Referring to FIG. 17, a first insulating layer 310 may be formed on an inner wall of the cell contact hole 160H. The first insulating layer 310 may completely fill the cell contact hole 160H and the first extension portion 160E1 on the insulating liner 162L. The first insulating layer 310 may be formed on partial regions of each of the first preliminary pad layer S130P1 and/or the second preliminary pad layer S130P2 within the first extension portion 160E1. The first insulating layer 310 may contact portions of each of the first preliminary pad layer S130P1 and/or the second preliminary pad layer S130P2 within the first extension portion 160E1. For example, the first insulating layer 310 may be formed using silicon nitride.

Figure 18:
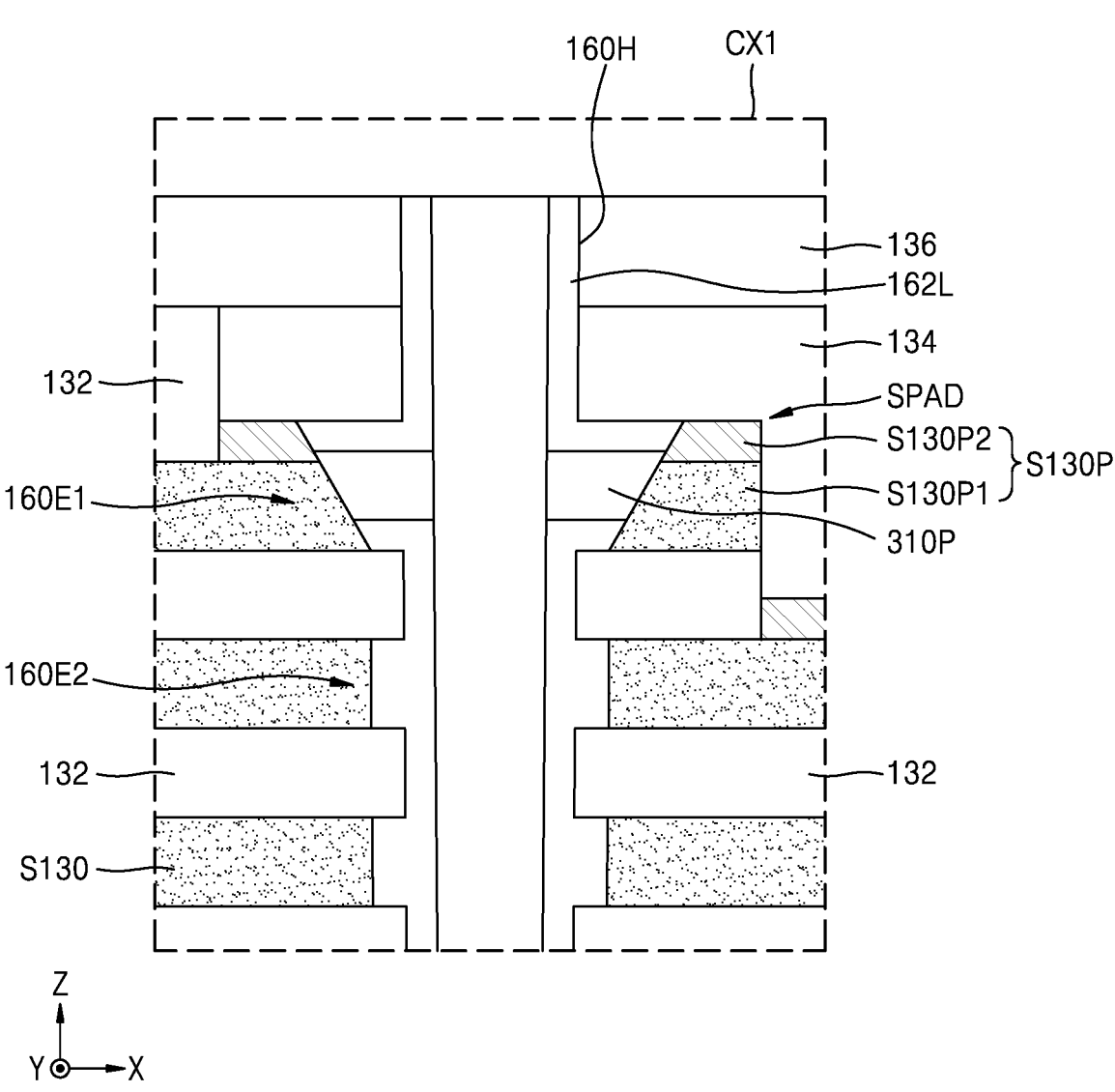

Referring to FIG. 18, a first insulating pattern 310P may remain in the first extension portion 160E1 by removing a portion of the first insulating layer 310 inside the cell contact hole 160H by a wet etching process. The first insulating pattern 310P may fill the first extension portion 160E1, and may contact a portion of each of the first preliminary pad layer S130P1 and/or the second preliminary pad layer S130P2 within the first extension portion 160E1.

Figure 19:
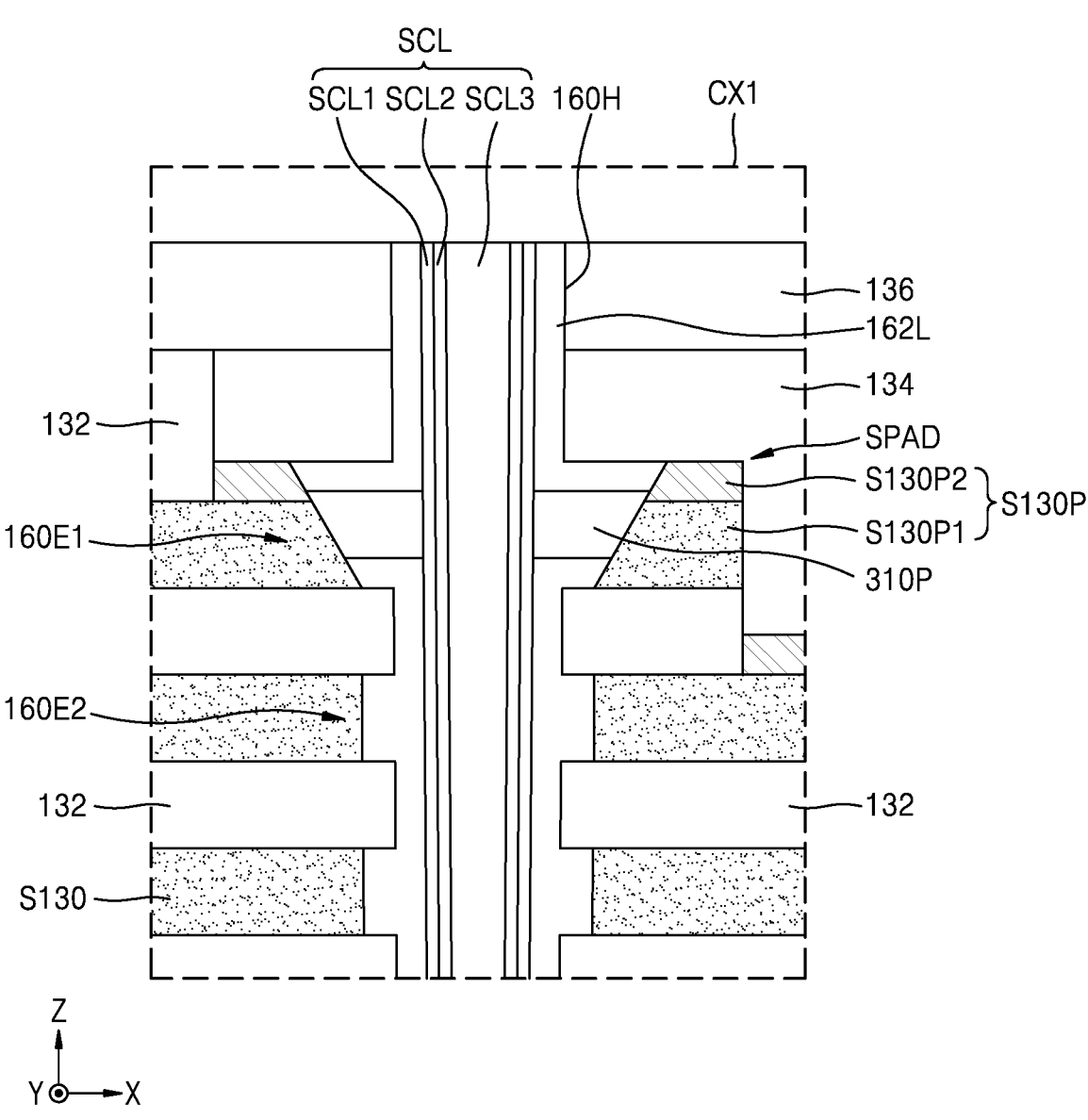

Referring to FIG. 19, a cell contact sacrificial film SCL may be formed inside the cell contact hole 160H. The cell contact sacrificial layer film SCL may completely fill the cell contact hole 160H on the insulating liner 162L. The cell contact sacrificial film SCL may be formed on the first insulating pattern 310P. Specifically, the cell contact sacrificial film SCL may include a first sacrificial film SCL1, a second sacrificial film SCL2, and a third sacrificial film SCL3.

Initially, the first sacrificial film SCL1 may be formed along a sidewall and a bottom surface of the cell contact hole 160H. Afterwards, the second sacrificial film SCL2 may be formed on the first sacrificial film SCL1. Finally, the third sacrificial film SCL3 may be formed on the second sacrificial film SCL2. The first sacrificial film SCL1 and the second sacrificial film SCL2 may include an insulating material. For example, the first sacrificial film SCL1 may be formed using a silicon oxide film. The second sacrificial film SCL2 may be formed using a silicon nitride film. The third sacrificial film SCL3 may be formed using a polysilicon film.

Figure 20:
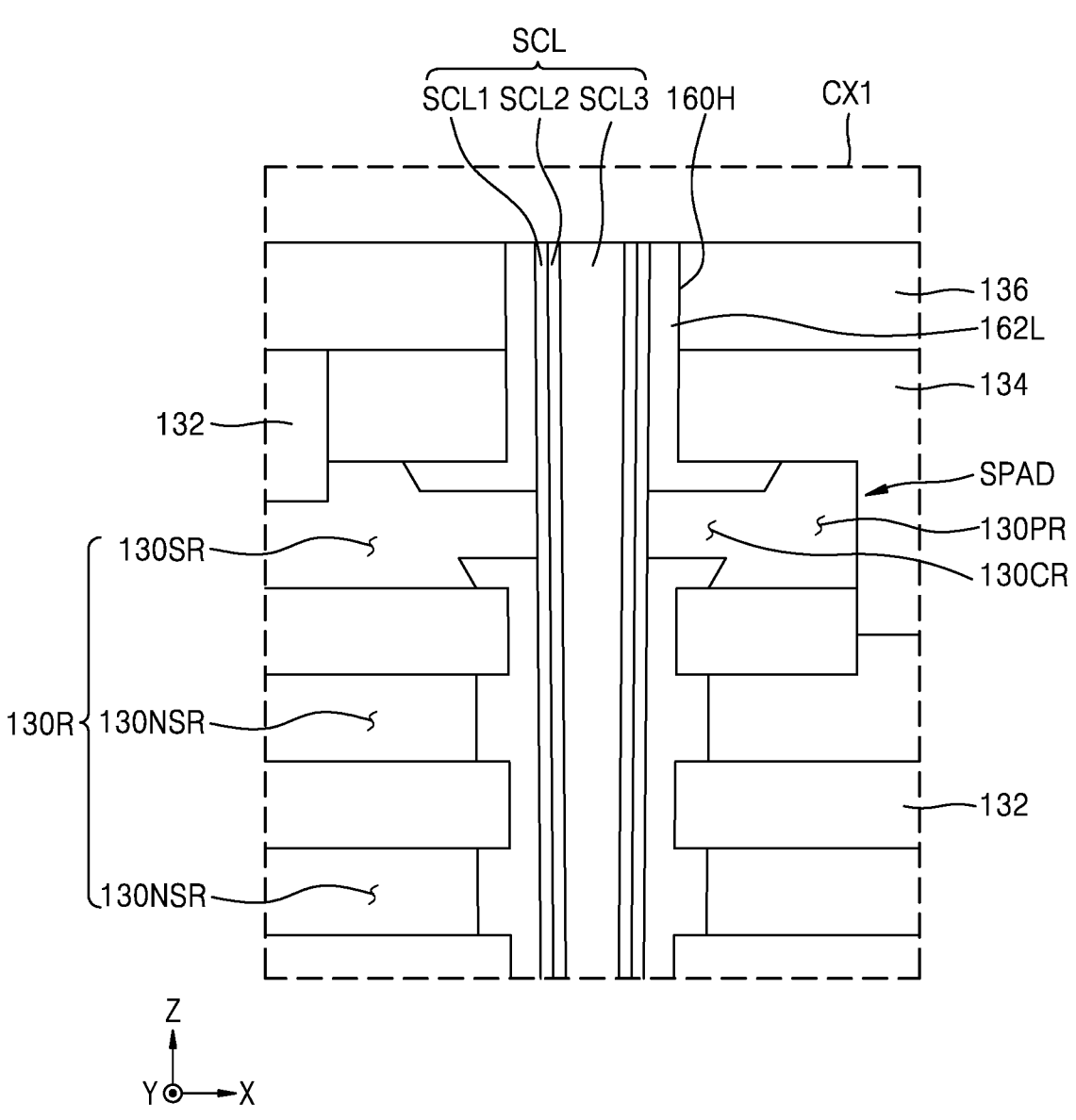

Referring to FIG. 20, a plurality of gate spaces 130R may be formed by removing the first preliminary pad layer S130P1, the second preliminary pad layer S130P2, and the first insulating pattern 310P. In some embodiments, the process of removing the first preliminary pad layer S130P1, the second preliminary pad layer S130P2, and the first insulating pattern 310P may be an etching process using an etchant including phosphoric acid (HPO$_3$). As the plurality of sacrificial layers S130 are removed, a portion of the sidewall of the channel structure 140 shown in FIG. 5 may be exposed.

Specifically, a first gate space 130SR may be formed by removing the first preliminary pad layer S130P1, the second preliminary pad layer S130P2, and the first insulating pattern 310P. For example, a connection portion space 130CR and a pad portion space 130PR may be formed. Accordingly, portions of the insulating liner 162L and the first sacrificial film SCL1 may be exposed.

Specifically, a plurality of second gate spaces 130NSR may be formed by removing the first preliminary pad layer S130P1. As a result, a portion of the insulating liner 162L may be exposed.

Figure 21:
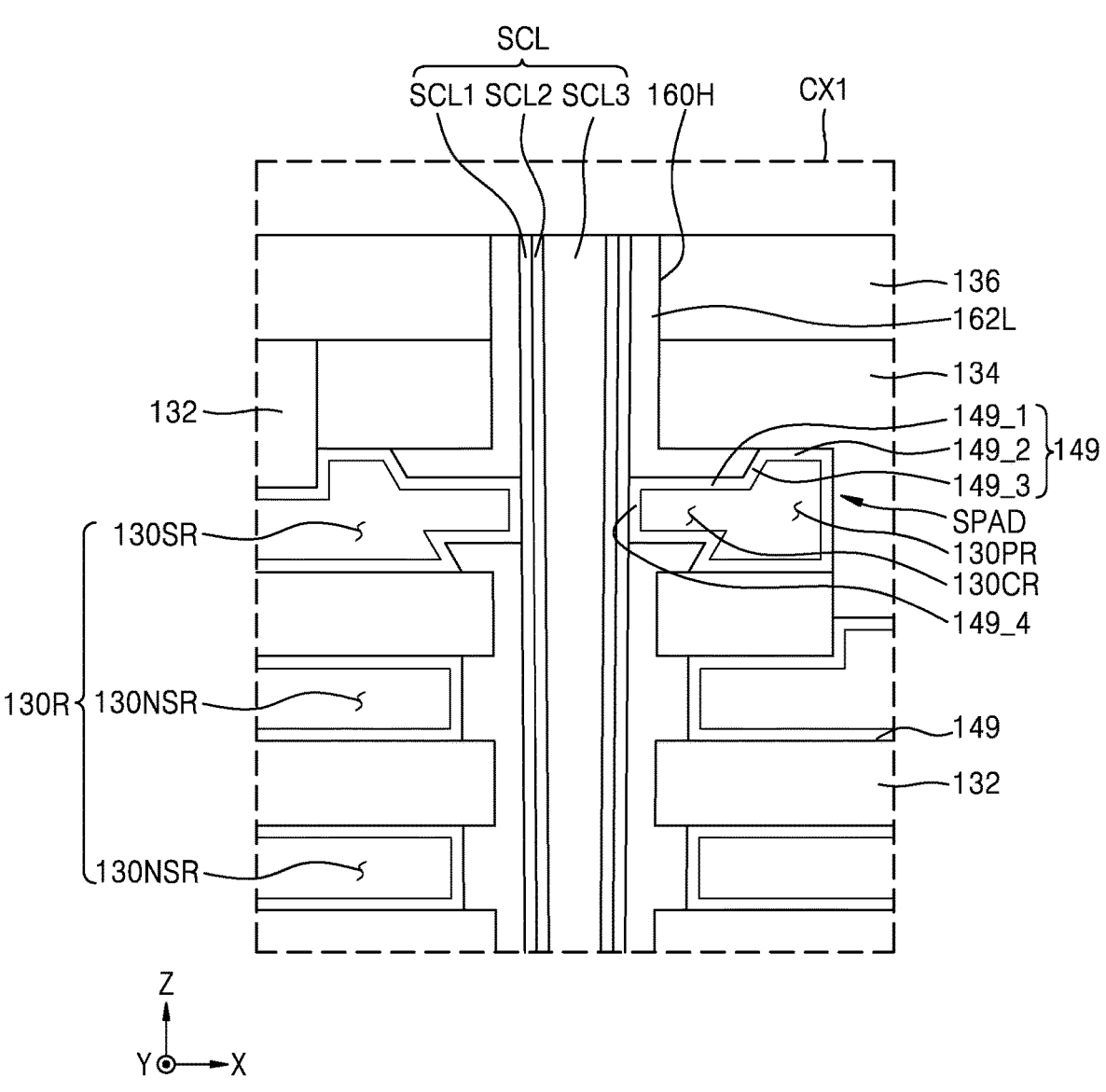

Referring to FIG. 21, a dielectric liner 149 may be formed on inner walls of the plurality of gate spaces 130R. In detail, the dielectric liner 149 may be conformally on inner walls of the first gate space 130SR and the plurality of second gate spaces 130NSR. For example, the dielectric liner 149 may be conformally on inner walls of the connection portion space 130CR and the pad portion space 130PR and on the first sacrificial film SCL1. For example, a first portion 149_1, a second portion 149_2, and a third portion 149_3 of the dielectric liner 149 are conformally on inner walls of the connection space 130CR and the pad space 130PR. As another example, a fourth portion 149_4 of the dielectric liner 149 may be conformally on a portion of the first sacrificial film SCL1.

Figure 22:
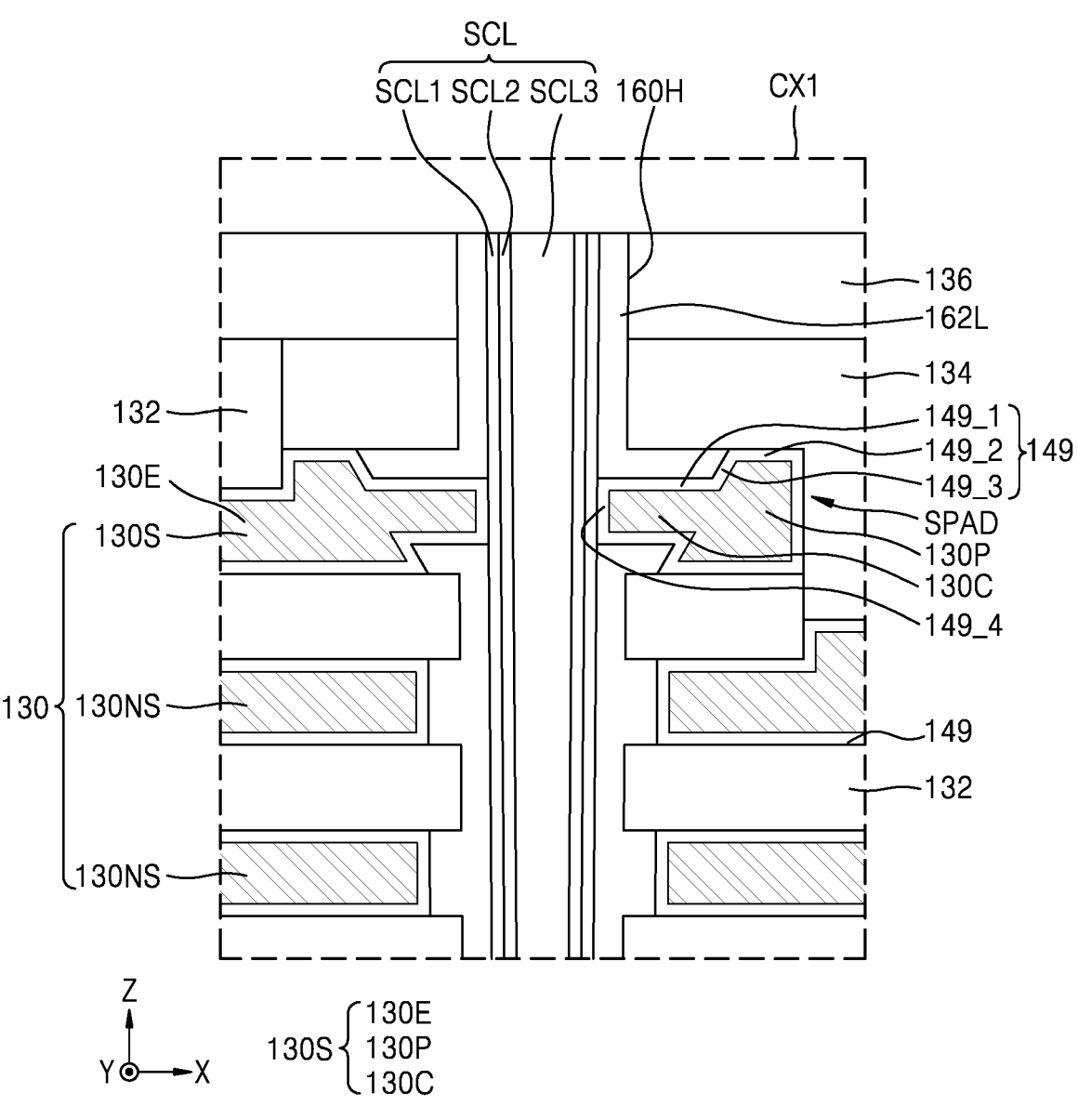

Referring to FIG. 22, a plurality of gate electrodes 130 may be formed by filling a conductive material in a plurality of gate spaces 130R (see FIG. 21). Specifically, the first gate electrode 130S may be formed by filling a conductive material in the first gate space 130SR (see FIG. 21). For example, the connection portion 130C and the pad portion 130P may be formed by filling a conductive material in the connection portion space 130CR (see FIG. 21) and the pad portion space 130PR (see FIG. 21). Specifically, the second gate electrode 130NS may be formed by filling a conductive material in the second gate space 130NSR (see FIG. 21).

Figure 23:
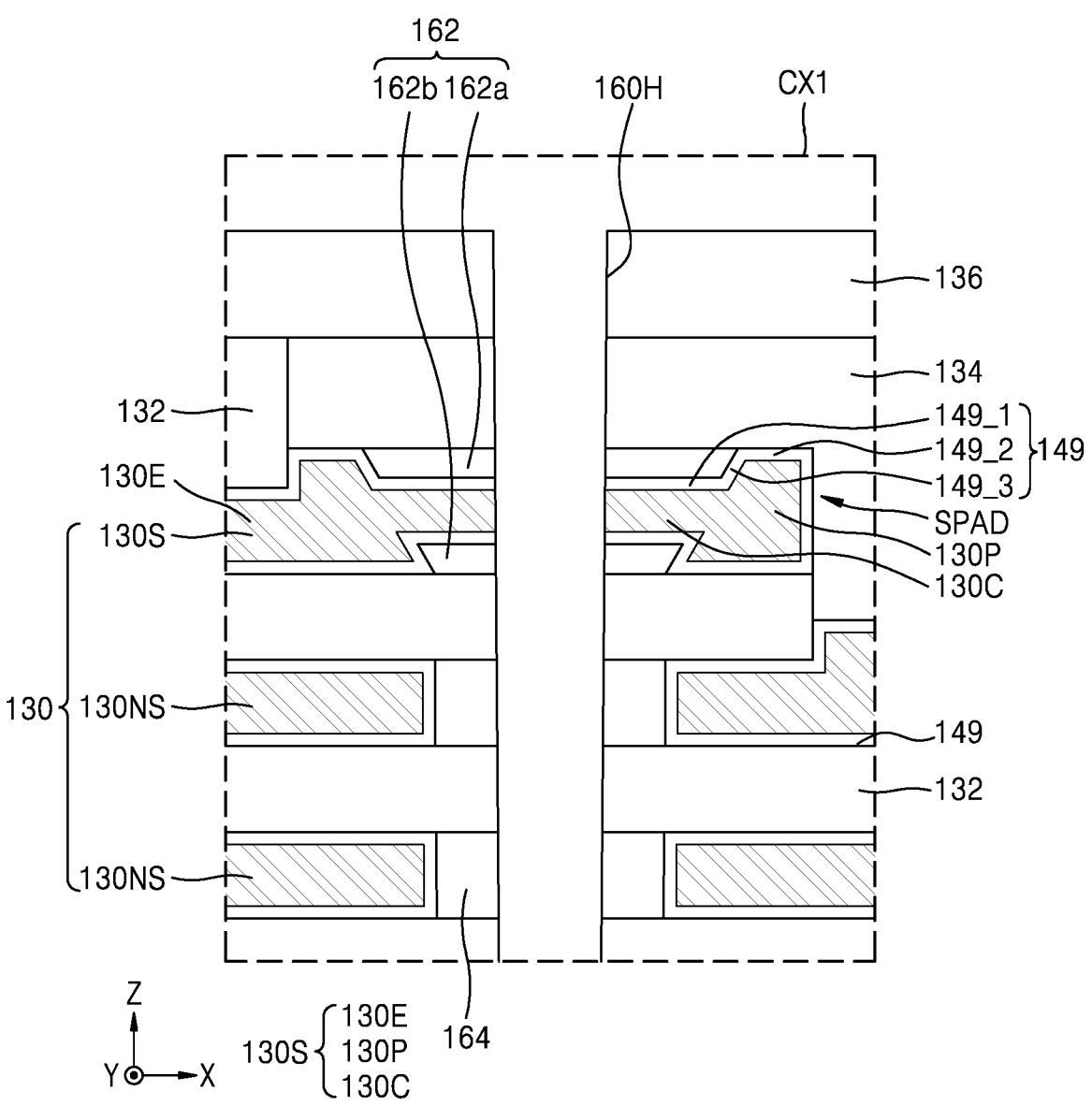

Referring to FIG. 23, the inner wall of the cell contact hole 160H is exposed again by removing a portion of the cell contact sacrificial film SCL and the insulating liner 162L, and the one or more first insulating rings 162 and the second insulating ring 164 may be formed. The one or more first insulating rings 162 and the second insulating ring 164 may be formed by removing a portion of the insulating liner 162L in the cell contact hole 160H. The one or more first insulating ring 162 and the second insulating ring 164 may be formed to have an annular or ring shape.

In the removal process, the fourth portion 149_4 of the dielectric liner 149 inside the cell contact hole 160H and formed on the first sacrificial film SCL1 may be removed together.

The first gate electrode 130S, the one or more first insulating rings 162 on the first gate electrode 130S, the dielectric liner 149 on the first gate electrode 130S, and the second insulating rings 164 may be exposed by the inner wall of the cell contact hole 160H. Specifically, the connection portion 130C, the first upper insulating ring 162a and the first lower insulation ring 162b on the connection portion 130C, and the first portion 149_1 of the dielectric liner 149 on the connection portion 130C may be exposed by the inner wall of the cell contact hole 160H. On the other hand, the second gate electrode 130NS may not be exposed.

Figure 24:
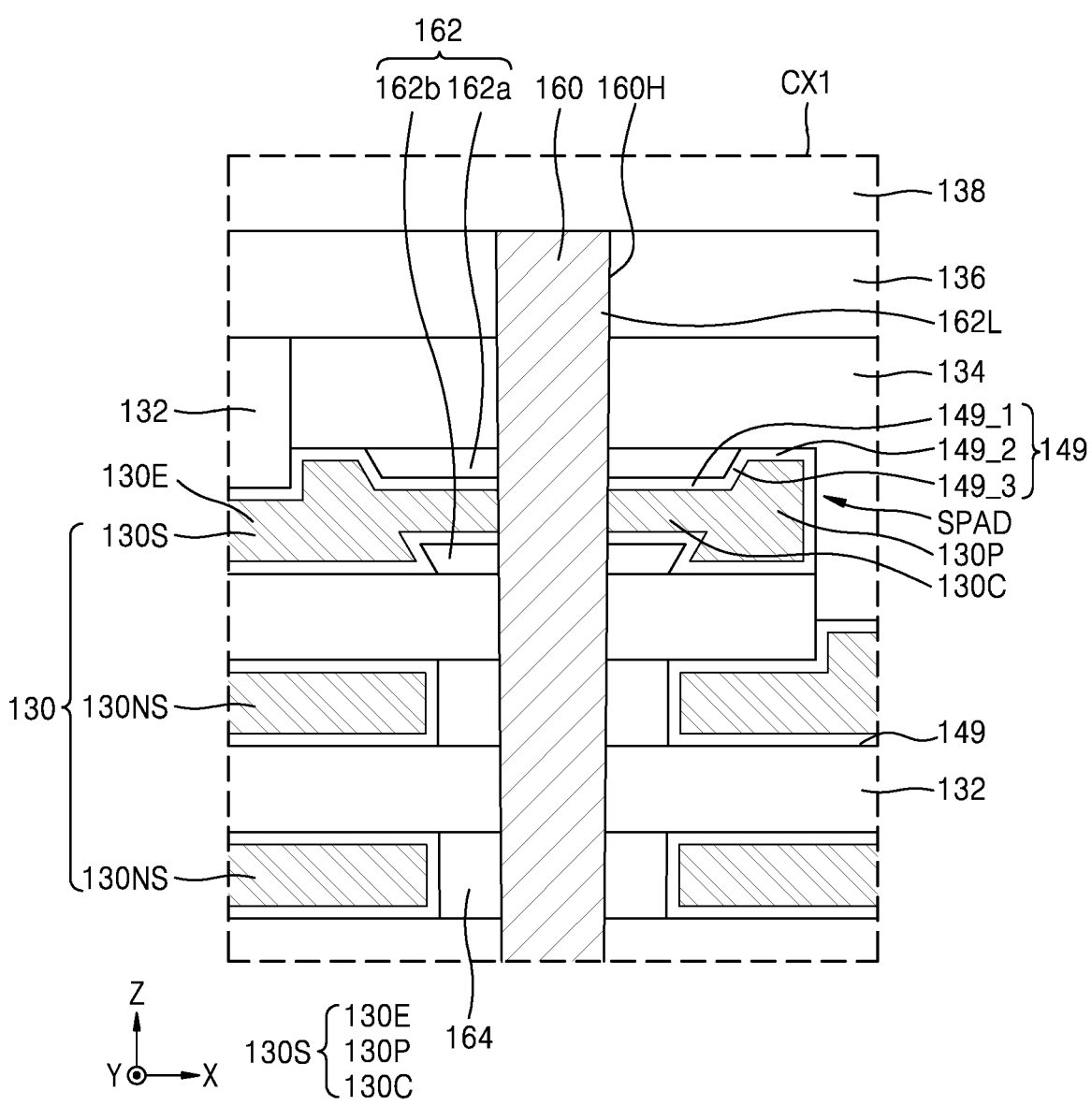

Referring to FIG. 24, a conductive layer (not shown) filling an inside of the cell contact hole 160H is formed, and afterwards, a cell contact 160 may be formed in the cell contact hole 160H by planarizing an upper portion of the conductive layer until an upper surface of the first upper insulating layer 136 is exposed.

For example, the cell contact 160 may be formed using tungsten, titanium, tantalum, copper, aluminum, titanium nitride, tantalum nitride, tungsten nitride, or a combination thereof.

Referring to FIGS. 24 and 5 again, a bit line contact BLC electrically connected to the channel structure 140 may be formed through the first upper insulating layer 136.

Thereafter, a bit line BL electrically connected to the bit line contact BLC is formed on the memory cell region MCR, and a wiring line ML1 electrically connected to the conductive through via 170 may be formed on the peripheral circuit connection region PRC. Afterwards, a second upper insulating layer 138 surrounding sidewalls of the bit line BL and the wiring line ML1 may be formed on the first upper insulating layer 136.

The manufacture of the non-volatile memory device 100 may be completed by performing the processes described above.

Figure 25:
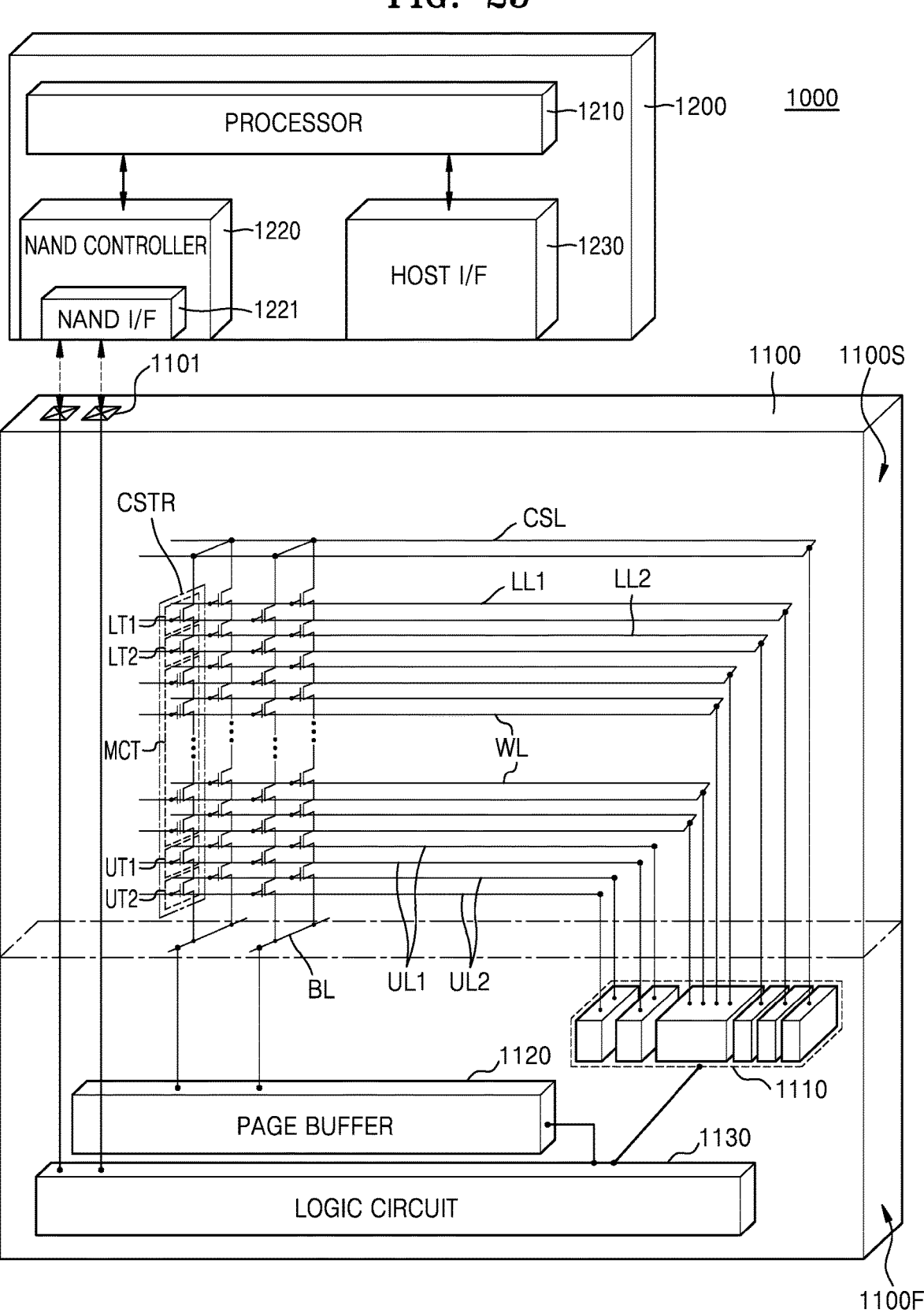
FIG. 25 is a schematic diagram illustrating a data storage system including a non-volatile memory device according to embodiments of the present disclosure.

FIG. 25 is a schematic diagram illustrating a data storage system 1000 including a non-volatile memory device 1100 according to embodiments.

Referring to FIG. 25, the data storage system 1000 may include one or more non-volatile memory devices 1100 and a memory controller 1200 electrically connected to the non-volatile memory device 1100. The data storage system 1000 may be, for example, a solid-state drive (SSD) device, a Universal Serial Bus (USB), a computing system, a medical device, or a communication device including at least one non-volatile memory device 1100.

For example, the non-volatile memory device 1100 may be a NAND flash non-volatile memory device including one of the non-volatile memory devices 10, 100, and 100A described with reference to FIGS. 1 to 9. The non-volatile memory device 1100 may include a first structure 1100F and a second structure 1100S on the first structure 1100F. The first structure 110OF may be a peripheral circuit structure including a row decoder 1110, a page buffer 1120, and a logic circuit 1130.

The second structure 1100S includes a bit line BL, a common source line CSL, a plurality of word lines WL, first and second string select lines UL1 and UL2, first and second ground select lines LL1 and LL2, and a plurality of memory cell strings CSTR between the bit line BL and the common source line CSL.

In the second structure 1100S, the plurality of memory cell strings CSTR may include ground select transistors LT1 and LT2 adjacent to the common source line CSL, respectively, string select transistors UT1 and UT2 adjacent to the bit line BL, respectively, and a plurality of memory cell transistors MCT between the ground select transistors LT1 and LT2 and the string select transistors UT1 and UT2. The number of the ground select transistors LT1 and LT2 and the number of the string select transistors UT1 and UT2 may be modified in other variations.

In some embodiments, the plurality of ground select lines LL1 and LL2 may be connected to gate electrodes of the ground select transistors LT1 and LT2, respectively. The word line WL may be connected to the gate electrode of the memory cell transistor MCT. The plurality of string select lines UL1 and UL2 may be connected to gate electrodes of the string select transistors UT1 and UT2, respectively.

The common source line CSL, the plurality of ground select lines LL1 and LL2, the plurality of word lines WL, and the plurality of string select lines UL1 and UL2 may be connected to the row decoder 1110. The plurality of bit lines BL may be electrically connected to the page buffer 1120.

The non-volatile memory device 1100 may communicate with the memory controller 1200 through an input/output pad 1101 electrically connected to the logic circuit 1130. The input/output pad 1101 may be electrically connected to the logic circuit 1130.

The memory controller 1200 may include a processor 1210, a NAND controller 1220, and a host interface 1230. In some embodiments, the data storage system 1000 may include a plurality of non-volatile memory devices 1100, and in this embodiment, the memory controller 1200 may control the plurality of non-volatile memory devices 1100.

The processor 1210 may control overall operations of the data storage system 1000 including the memory controller 1200. The processor 1210 may operate according to predetermined firmware and may access the non-volatile memory device 1100 by controlling the NAND controller 1220. The NAND controller 1220 may include a NAND interface 1221 that processes communication with the non-volatile memory device 1100. A control command for controlling the non-volatile memory device 1100, data to be written to a plurality of memory cell transistors MCT of the non-volatile memory device 1100, and data to be read from the plurality of memory cell transistors MCT of the non-volatile memory device 1100 may be transmitted through the NAND interface 1221. The host interface 1230 may provide a communication function between the data storage system 1000 and an external host. When a control command is received from an external host through the host interface 1230, the processor 1210 may control the non-volatile memory device 1100 in response to the control command.

Figure 26:
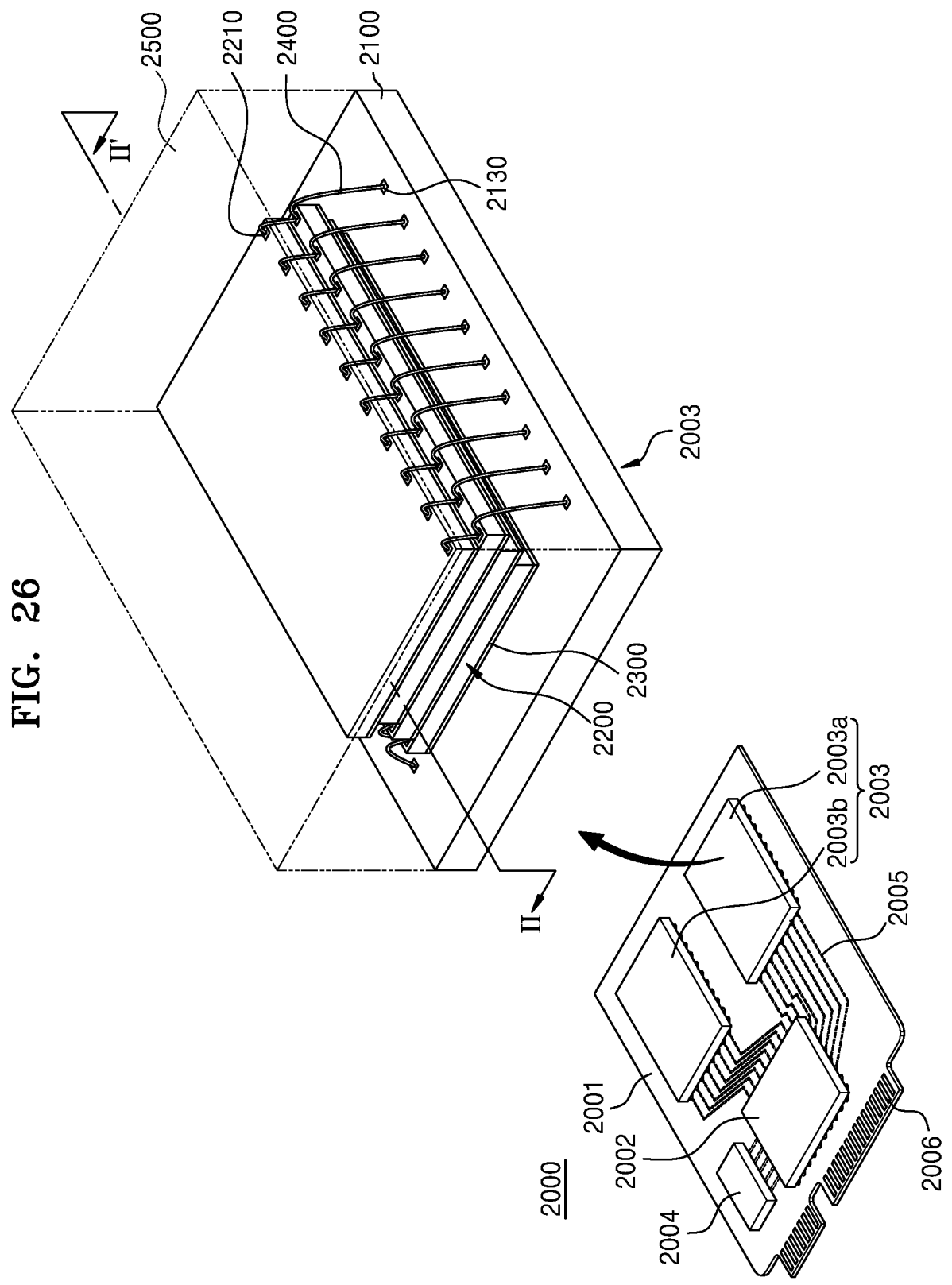
FIG. 26 is a schematic perspective view illustrating a data storage system including a non-volatile memory device according to embodiments of the present disclosure.

FIG. 26 is a perspective view schematically illustrating a data storage system 2000 including a non-volatile memory device according to embodiments.

Referring to FIG. 26, the data storage system 2000 according to an embodiment may include a main substrate 2001, a memory controller 2002 mounted on the main substrate 2001, one or more semiconductor packages 2003, and a DRAM 2004. The semiconductor package 2003 and the DRAM 2004 may be connected to the memory controller 2002 through a plurality of wiring patterns 2005 formed on the main substrate 2001.

The main substrate 2001 may include a connector 2006 including a plurality of pins coupled to an external host. The number and arrangement of the plurality of pins in the connector 2006 may vary depending on the communication interface between the data storage system 2000 and the external host. In some embodiments, the data storage system 2000 may communicate with an external host according to any one of interfaces, such as a USB, a Peripheral Component Interconnect Express (PCI-Express), a Serial Advanced Technology Attachment (SATA), a M-Phy for Universal Flash Storage (UFS), etc. In some embodiments, the data storage system 2000 may be operated by power supplied from an external host through the connector 2006. The data storage system 2000 may further include a power management integrated circuit (PMIC) that distributes power supplied from the external host to the memory controller 2002 and the semiconductor package 2003.

The memory controller 2002 may write data to the semiconductor package 2003, may read data from the semiconductor package 2003, and may improve an operating speed of the data storage system 2000.

The DRAM 2004 may be a buffer memory for mitigating a speed difference between the semiconductor package 2003, which is a data storage space, and an external host. The DRAM 2004 included in the data storage system 2000 may also operate as a kind of cache memory, and may provide a space for temporarily storing data in a control operation for the semiconductor package 2003. When the DRAM 2004 is included in the data storage system 2000, the memory controller 2002 may further include a DRAM controller for controlling the DRAM 2004 in addition to the NAND controller for controlling the semiconductor package 2003.

The semiconductor package 2003 may include first and second semiconductor packages 2003a and 2003b separated from each other. The first and second semiconductor packages 2003a and 2003b may be semiconductor packages each including a plurality of semiconductor chips 2200. Each of the first and second semiconductor packages 2003a and 2003b may include a package substrate 2100, a plurality of semiconductor chips 2200 on the package substrate 2100, an adhesive layer 2300 on a lower surface of each of the plurality of semiconductor chips 2200, a connection structure 2400 electrically connecting the plurality of semiconductor chips 2200 to the package substrate 2100, and a molding layer 2500 covering the plurality of semiconductor chips 2200 and the connection structure 2400 on the package substrate 2100.

The package substrate 2100 may be a printed circuit board including a plurality of package upper pads 2130. Each of the plurality of semiconductor chips 2200 may include an input/output pad 2210. The input/output pad 2210 may correspond to the input/output pad 1101 of FIG. 25. Each of the plurality of semiconductor chips 2200 may include at least one of the non-volatile memory devices 10, 100, and 100A described with reference to FIGS. 1 to 9.

In some embodiments, the connection structure 2400 may be a bonding wire electrically connecting the input/output pad 2210 to a package upper pad 2130. Accordingly, in the first and second semiconductor packages 2003a and 2003b, the plurality of semiconductor chips 2200 may be electrically connected to each other using a bonding wire method, and may be electrically connected to the package upper pad 2130 of the package substrate 2100. In some embodiments, the memory controller 2002 and the plurality of semiconductor chips 2200 may be included in one package.

Figure 27:
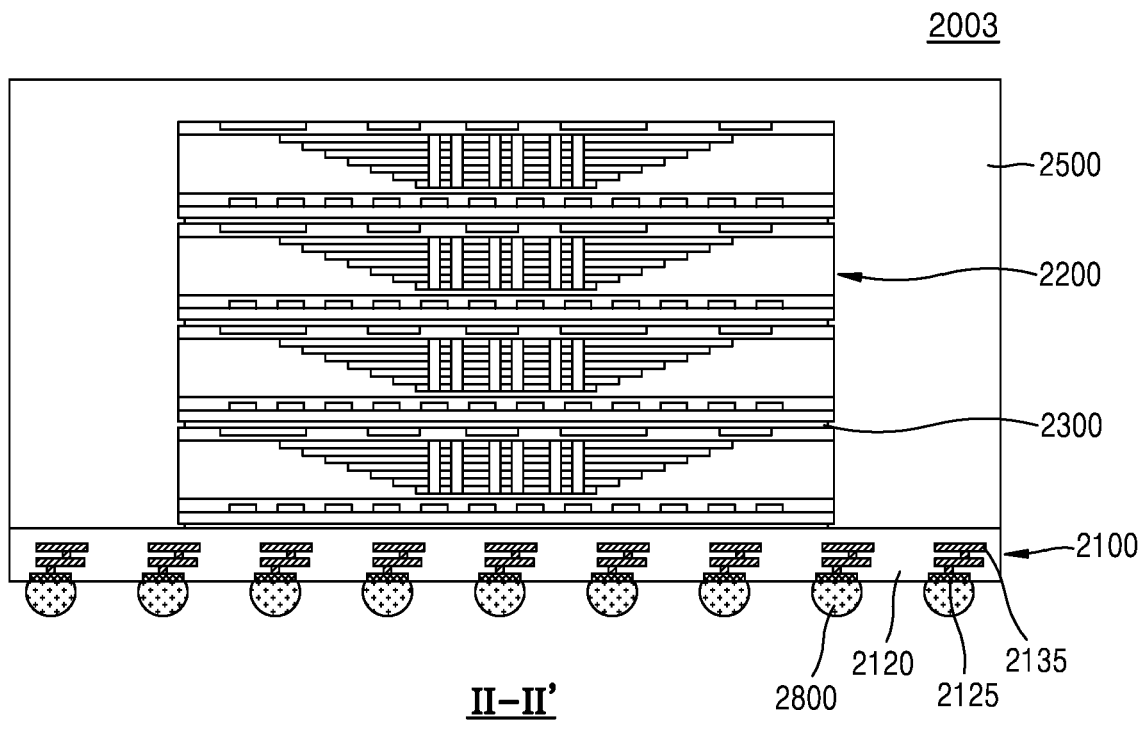
FIG. 27 is a schematic cross-sectional view illustrating semiconductor packages according to embodiments of the present disclosure.

In some embodiment, the memory controller 2002 and the plurality of semiconductor chips 2200 are mounted on a separate interposer substrate different from the main substrate 2001, and the memory controller 2002 and the plurality of semiconductor chips 2200 may be connected to each other by wirings formed on the interposer substrate. FIG. 27 is a schematic cross-sectional view illustrating semiconductor packages according to embodiments.

FIG. 27 is a cross-sectional view taken along line II-II' of FIG. 26. Referring to FIG. 27, in the semiconductor package 2003, the package substrate 2100 may be a printed circuit board.

The package substrate 2100 may include a package substrate body unit 2120, a plurality of package upper pads 2130 (refer to FIG. 26) on an upper surface of the package substrate body unit 2120, a plurality of lower pads 2125 on a lower surface of the package substrate body 2120 or exposed through the lower surface, and a plurality of internal wirings 2135 that electrically connect the plurality of package upper pads 2130 (refer to FIG. 26) and the plurality of lower pads 2125 inside the package substrate body unit 2120. As shown in FIG. 26, the plurality of package upper pads 2130 may be electrically connected to the plurality of connection structures 2400. As shown in FIG. 27, the plurality of lower pads 2125 may be connected to the plurality of wiring patterns 2005 on the main substrate 2001 of the data storage system 2000 shown in FIG. 26 through a plurality of conductive bumps 2800. Each of the plurality of semiconductor chips 2200 may include at least one of the non-volatile memory devices 10, 100, and 100A described with reference to FIGS. 1 to 9.

While the present disclosure has been particularly shown and described with reference to embodiments thereof, it will be understood that various changes in form and details may be made therein without departing from the spirit and scope of the following claims.

What is claimed is:

1. A non-volatile memory device comprising:
a substrate including a memory cell region and a connection region;
a mold structure including a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region and include a first gate electrode and a second gate electrode;
a channel structure that extends through the mold structure on the memory cell region;
a cell contact that extends through the mold structure, wherein the cell contact is electrically connected to the first gate electrode and is not electrically connected to the second gate electrode,
wherein the first gate electrode includes:
an extension portion that extends on the memory cell region;
a pad portion, wherein a vertical thickness of the pad portion is greater than a vertical thickness of the extension portion; and

25

26 a connection portion that electrically connects the pad portion to the cell contact, wherein a vertical thickness of the connection portion is less than the vertical thickness of the pad portion; and one or more first insulating rings on the connection portion.

2. The non-volatile memory device of claim 1, further comprising:

a dielectric liner between the first gate electrode and one of the plurality of mold insulating layers adjacent to the first gate electrode, wherein the dielectric liner includes:

a first portion between the connection portion of the first gate electrode and the one or more first insulating rings; and a second portion on an upper surface and a bottom surface of the pad portion of the first gate electrode.

3. The non-volatile memory device of claim 2, wherein the dielectric liner further includes a third portion between the pad portion of the first gate electrode and the one or more first insulating rings, and wherein the dielectric liner is not parallel to the first gate electrode.

4. The non-volatile memory device of claim 1, wherein:

the connection portion includes a first surface and a second surface between the first surface and the second gate electrode, the one or more first insulating rings include a first upper insulating ring on the first surface of the connection portion and a first lower insulating ring on the second surface of the connection portion, and a horizontal length of the first upper insulating ring is greater than a horizontal length of the first lower insulating ring.

5. The non-volatile memory device of claim 1, further comprising:

a second insulating ring between the second gate electrode and a sidewall of the cell contact, wherein a horizontal length of the one or more first insulating rings is greater than a horizontal length of the second insulating ring.

6. The non-volatile memory device of claim 1, wherein the vertical thickness of the connection portion is greater than or equal to the vertical thickness of the extension portion.

7. The non-volatile memory device of claim 1, wherein the vertical thickness of the pad portion is greater than or equal to two times of the vertical thickness of the connection portion.

8. The non-volatile memory device of claim 1, further comprising:

an insulating liner between the plurality of mold insulating layers and a sidewall of the cell contact.

9. A non-volatile memory device comprising:

a peripheral circuit substrate;

a peripheral circuit on the peripheral circuit substrate;

a cell substrate including a memory cell region and a connection region on the peripheral circuit substrate;

a cell contact that extends through a mold structure, wherein the mold structure includes a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region, and wherein the plurality of gate electrodes include a first gate electrode and a second gate electrode;

wherein the first gate electrode includes an extension portion that extends on the memory cell region, a pad portion, and a connection portion, wherein a vertical thickness of the pad portion is greater than a vertical thickness of the extension portion, wherein a vertical thickness of the connection portion is less than the vertical thickness of the pad portion, and wherein the connection portion electrically connects the pad portion to the cell contact; and wherein the cell contact is connected to the connection portion of the first gate electrode and is not electrically connected to the second gate electrode in the connection region;

a channel structure that extends through the mold structure on the memory cell region; and one or more first insulating rings on the connection portion; and a dielectric liner between the first gate electrode and a first mold insulating layer of the plurality of mold insulating layers adjacent to the first gate electrode, and wherein the dielectric liner includes a first portion between the connection portion and the one or more first insulating rings.

10. The non-volatile memory device of claim 9, wherein the dielectric liner further includes:

a second portion on an upper surface and a bottom surface of the pad portion of the first gate electrode; and a third portion that is not parallel to the first gate electrode.

11. The non-volatile memory device of claim 10, further comprising a second insulating ring between the second gate electrode and a sidewall of the cell contact, wherein the second portion of the dielectric liner does not overlap with the second insulating ring in a vertical direction.

12. The non-volatile memory device of claim 9, further comprising:

a second insulating ring between the second gate electrode and a sidewall of the cell contact, wherein the connection portion includes a sub-portion that does not overlap with the second insulating ring in a vertical direction.

13. The non-volatile memory device of claim 9, wherein:

the pad portion includes a sidewall that does not overlap with the connection portion in a horizontal direction, and the dielectric liner includes a third portion that contacts the one or more first insulating rings, wherein the third portion is on the sidewall of the pad portion.

14. The non-volatile memory device of claim 9, wherein the vertical thickness of the connection portion is greater than or equal to a vertical thickness of the extension portion.

15. The non-volatile memory device of claim 9, wherein the vertical thickness of the pad portion is greater than or equal to two times of the vertical thickness of the connection portion.

16. An electronic system comprising:

a main substrate;

a non-volatile memory device on the main substrate; and a controller that is electrically connected to the non-volatile memory device, wherein the non-volatile memory device includes a substrate including a memory cell region and a connection region;

a cell contact that extends through a mold structure, the mold structure including a plurality of gate electrodes sequentially stacked on the memory cell region and the connection region and a plurality of mold insulating layers alternately stacked with the plurality of gate electrodes, wherein the plurality of gate electrodes are stacked in a step shape on the connection region, wherein the plurality of gate electrodes include a first gate electrode and a second gate electrode, wherein the first gate electrode includes an extension portion that extends on the memory cell region, a pad portion, and a connection portion, wherein a vertical thickness of the pad portion is greater than a vertical thickness of the extension portion, wherein a vertical thickness of the connection portion is less than the vertical thickness of the pad portion, wherein the connection portion electrically connects the pad portion to the cell contact, wherein the cell contact is connected to the connection portion of the first gate electrode, and wherein the cell contact is not electrically connected to the second gate electrode in the connection region;

a channel structure that extends through the mold structure on the memory cell region;

a first insulating ring on the connection portion; and a dielectric liner between the first gate electrode and a first mold insulating layer of the plurality of mold insulating layers, and the dielectric liner includes a first portion between the connection portion and the first insulating ring.

17. The electronic system of claim 16, wherein the dielectric liner further includes:

a second portion on an upper surface and a bottom surface of the pad portion of the first gate electrode; and a third portion between the pad portion of the first gate electrode and the first insulating ring, wherein the third portion is not parallel to the first gate electrode.

18. The electronic system of claim 16, further comprising a second insulating ring between the second gate electrode and a sidewall of the cell contact, wherein the pad portion does not overlap the second insulating ring.

19. The electronic system of claim 16, wherein the vertical thickness of the connection portion is greater than or equal to a vertical thickness of the extension portion.

20. The electronic system of claim 16, wherein the vertical thickness of the pad portion is greater than or equal to two times of the vertical thickness of the connection portion.

* * * * *